(12) United States Patent
Uppal et al.

(10) Patent No.: US 11,574,851 B2
(45) Date of Patent: Feb. 7, 2023

(54) COUPLED COOLING FINS IN ULTRA-SMALL SYSTEMS

(71) Applicant: Intel Corporation, Santa Clara, CA (US)

(72) Inventors: Aastha Uppal, Chandler, AZ (US); Omkar Karhade, Chandler, AZ (US); Ram Viswanath, Phoenix, AZ (US); Je-Young Chang, Phoenix, AZ (US); Weihua Tang, Chandler, AZ (US); Nitin Deshpande, Chandler, AZ (US); Mitul Modi, Phoenix, AZ (US); Edvin Cetegen, Chandler, AZ (US); Sanka Ganesan, Chandler, AZ (US); Yiqun Bai, Chandler, AZ (US); Jan Krajniak, Phoenix, AZ (US); Kumar Singh, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 833 days.

(21) Appl. No.: 16/287,116

(22) Filed: Feb. 27, 2019

(65) Prior Publication Data
US 2020/0273772 A1  Aug. 27, 2020

(51) Int. Cl.
| | | |
|---|---|---|
| H01L 23/00 | (2006.01) | |
| H01L 23/367 | (2006.01) | |
| H01L 23/373 | (2006.01) | |
| H01L 23/427 | (2006.01) | |
| H01L 25/18 | (2006.01) | |
| H01L 21/56 | (2006.01) | |

(52) U.S. Cl.
CPC .......... *H01L 23/3675* (2013.01); *H01L 21/56* (2013.01); *H01L 23/3672* (2013.01); *H01L 23/3677* (2013.01); *H01L 23/3733* (2013.01); *H01L 23/3736* (2013.01); *H01L 23/427* (2013.01); *H01L 25/18* (2013.01); *H01L 24/16* (2013.01); *H01L 2224/16227* (2013.01)

(58) Field of Classification Search
CPC ....... H01L 2224/16227; H01L 23/3672; H01L 23/3677; H01L 23/3733–3736; H01L 23/427; H01L 25/15; H01L 24/16; H01L 2224/16–16501
See application file for complete search history.

(56) References Cited

U.S. PATENT DOCUMENTS

| | | | | |
|---|---|---|---|---|
| 7,160,758 | B2 * | 1/2007 | Fitzgerald | H01L 21/4871 257/E23.087 |
| 9,842,241 | B2 * | 12/2017 | Pant | G06V 40/10 |
| 2007/0080387 | A1 * | 4/2007 | Liu | H01L 27/10823 257/303 |

\* cited by examiner

*Primary Examiner* — Hoa B Trinh
(74) *Attorney, Agent, or Firm* — Essential Patents Group, LLP.

(57) ABSTRACT

An apparatus is provided which comprises: a package substrate, an integrated circuit device coupled to a surface of the package substrate, a first material on the surface of the package substrate, the first material contacting one or more lateral sides of the integrated circuit device, the first material extending at least to a surface of the integrated circuit device opposite the package substrate, two or more separate fins over a surface of the integrated circuit device, the two or more fins comprising a second material having a different composition than the first material, and a third material having a different composition than the second material, the third material over the surface of the integrated circuit device and between the two or more fins. Other embodiments are also disclosed and claimed.

23 Claims, 14 Drawing Sheets

COUPLED COOLING FINS IN ULTRA-SMALL SYSTEMS

BACKGROUND

As computing devices continue to get smaller and more powerful, thermal management solutions need to evolve to meet new challenges. Active thermal solutions, such as an electric fan, for example, are generally not feasible in an ultra-small system with very constrained dimensional requirements. Therefore, passive thermal solutions, including natural convection in the system and the use of thermally conductive material coupled with integrated circuit devices to dissipate heat, are necessary to prevent devices from overheating. While the power demands, and therefore heat generation, of ultra-small systems continues to increase, critical temperature limits, which are not to be exceeded, in integrated circuit devices are generally unchanged at around 100 degrees Celsius.

Conventionally, solutions for passive thermal conduction for integrated circuit devices in ultra-small systems have included thermally conductive over-mold material or placement of a dummy die in contact with the base die. However, thermally conductive over-mold material may not have sufficiently high thermal conductivity to prevent overheating in devices that have power demands exceeding 4 Watts and a dummy die in contact with the base die may pose reliability issues due to mechanical warpage. Therefore, there is a need for device packages with passive thermal solutions that can protect devices from overheating with increasing power demands and do not risk mechanical warpage.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Coupled cooling fins in ultra-small systems are generally presented. In this regard, embodiments of the present disclosure enable highly thermally conductive fins to be formed in contact with areas of high power and heat density on a device surface. In this way, a highly thermally conductive material can be coupled with the die during the manufacturing process that provides conductive and convective cooling and that doesn't add significant risk of mechanical warpage. One skilled in the art would appreciate that this approach may enable more reliable manufacturing with better thermal performance and lower z-heights.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicates that different instances of like objects are being referred to, and is not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

Figure 1A:
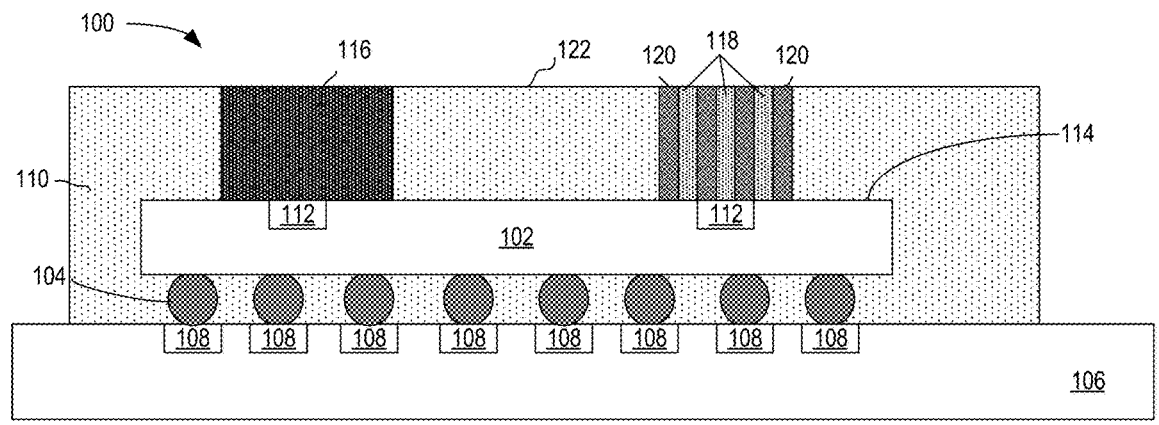
FIGS. 1A & 1B illustrate cross-sectional and overhead views, respectively, of an example integrated circuit device package with coupled cooling fins, according to some embodiments.
Figure 1B:
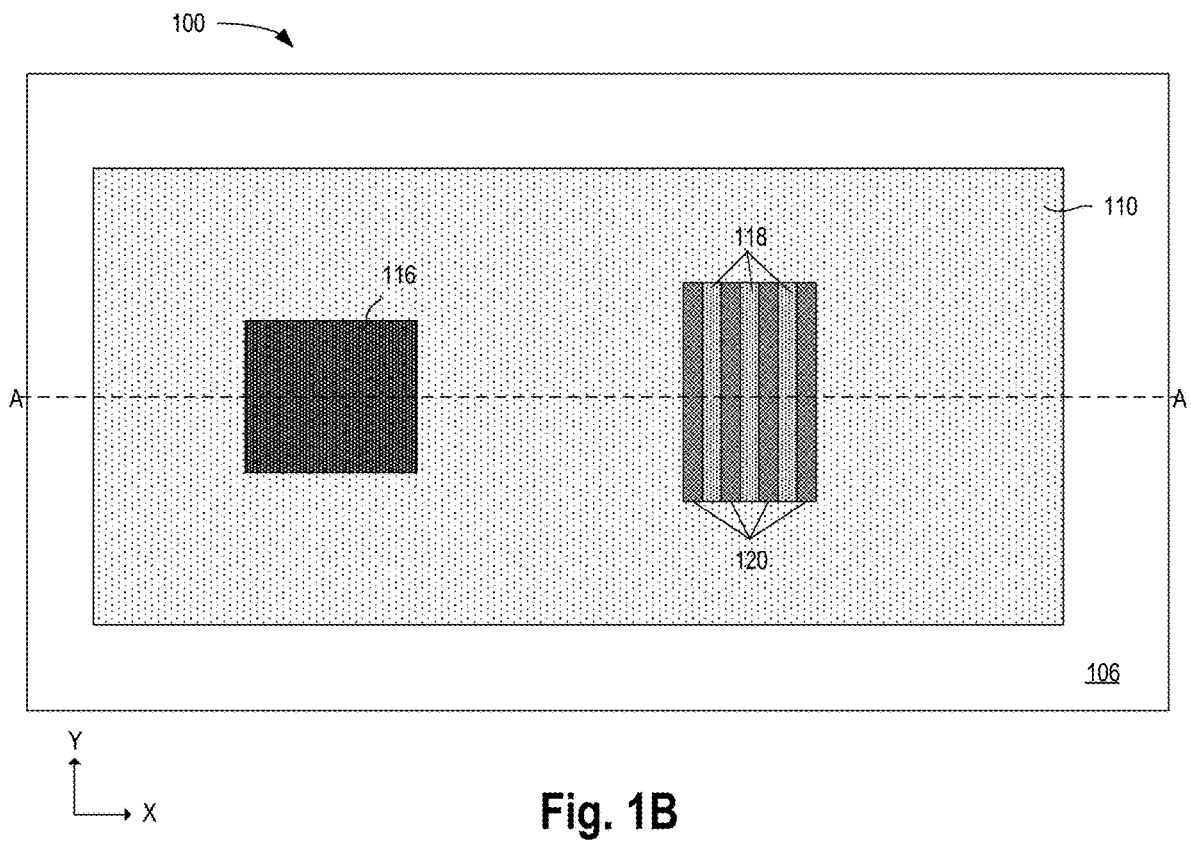

FIGS. 1A & 1B illustrate cross-sectional (viewed along cross-sectional line a-a) and overhead views, respectively, of an example integrated circuit device package with coupled cooling fins, according to some embodiments. As shown, package 100 includes integrated circuit device 102, device contacts 104, package substrate 106, substrate pads 108, mold material 110, device hotspots 112, device surface 114, a singular fin 116, a plurality of adjacent fins 118, thermally conductive filler 120, and coplanar interface 122. In some embodiments, package 100 may represent a computing or communication device. Package 100 may be integrated as part of any type of system, including, but not limited to, a personal computing, mobile, desktop, laptop, or server system. It should be appreciated that multiple embodiments are illustrated in combination within package 100, including fin 116 embedded within mold material 110 in one location, and fins 118 embedded within mold material 110 in another location. A package may however include either only a single fin or only a fin array. A package may also include either, or both, in further combination with other features shown in other embodiments hereinafter.

Integrated circuit device 102 may represent any type of device including, but not limited to, a processor, a controller, a field programmable gate array (FPGA), an electronic memory, a wireless radio, etc. Device contacts 104 may represent solder features, such as solder balls or microbumps, for example. Substrate pads 108 may represent conductive contacts, such as solder pads, etc. coupled to input/output signal paths, power, ground rails, etc. to and from integrated circuit device 102. Integrated circuit device 102 may couple with substrate 106 through any known method including, but not limited to soldering. In some embodiments, each device contact 104 is coupled with a substrate pad 108.

In some embodiments, device hotspots 112 represent locations on device surface 114 that are associated with relatively higher heat production. In some embodiments, device hotspots 112 are locations on device surface 114 that have been identified (e.g., through modeling and/or empirical measurement) to experience relatively higher power dissipation during device operation. In some embodiments, device hotspots 112 are locations on device surface 114 that are adjacent to relatively higher concentrations of integrated circuit components, such as transistors, within integrated circuit device 102, and would, at least theoretically, be considered more likely to be higher heat sources. In some embodiments, device hotspots 112 may be identified based on material composition or other properties of integrated circuit device 102.

In some embodiments, mold material 110 is a dielectric material that has been deposited between integrated circuit device 102 and package substrate 106, to provide mechanical support and stability. In some embodiments, mold material 110 is an epoxy mold material, though other mold materials may be used. In some embodiments, mold material 110 may extend beyond device surface 114 to varying extents. In some embodiments, mold material 110 may extend beyond device surface 114 in the z-dimension to coplanar interface 122, where the surface of mold material 110 may be substantially coplanar with one or more top surface of fin 116, top surfaces of fins 118, and/or top surface(s) of thermally conductive filler 120. In some embodiments, mold material 110 has a thermal conductivity lower than that of fin 116, fins 118, and thermally conductive filler 120. In the illustrated example, fin 116 and fins 118 are in contact with a semiconductor material (e.g., where device surface 114 is a back side of a semiconductor chip) in proximity to hotspots 112. While fin 116 and/or fins 118 may be advantageously thermally coupled to device surface 114, fin 116 and/or fins 118 may be electrically isolated from integrated circuitry.

Fin 116 and fins 118 may have any footprint, such as a square or rectangle, when viewed from overhead (e.g., FIG. 1B). Fin 116 and fins 118 may have any profile, such as a square or rectangle, when viewed from a side (e.g., FIG. 1A). In some embodiments, fin 116 has a longitudinal length (e.g., y-dimension) that is greater than or equal to a transverse width (e.g., x-dimension). Fin 116 may also have a height (e.g., z-dimension) that is greater than or less than either of the longitudinal length or transverse width. In some embodiments, fin 116 has a height (e.g., z-dimension), relative to device surface 114 that is less than the transverse width and may be ½, ¼, or less of the transverse width, for example. In some embodiments, fin 116 comprises a high thermal conductivity material, such as a material having a thermal conductivity of greater than about 20 watts per meter-kelvin. Fin 116 may therefore spread heat over its footprint and/or help to dissipate heat from its surface. The high thermal conductivity material may be in direct contact with mold material 110. In some embodiments, fin 116 comprises a composite material, for example including metal particles such as copper or aluminum, or gold for example, in a matrix material. The matrix material may be a dielectric, such as an epoxy, for example. Fin 116 may also comprise a phase change material, such as a solid-solid phase change material, however other phase change materials may be used. In some embodiments, fin 116 may be present at multiple locations on device surface 114, in addition to, or instead of, fins 118.

Fins 118 comprises two or more fins that are not directly contacting mold material 110. In the illustrated example, fins 118 have higher aspect ratio than fin 116. Fins 118 may have, for example, a longitudinal length (e.g., y-dimension) that is two-ten, or more times a transverse width (e.g., x-dimension). In some further embodiments, fins 118 have a height (e.g., z-dimension), relative to device surface 114 that is at least equal to the transverse width and may be 2, 3, 5, or more times the transverse width. Fins 118 may therefore also spread heat over a footprint of the array and/or help to dissipate heat from surfaces of the fin array. In contrast to fin 116, fins 118 are spaced apart from mold material 110. Spacing between fins and mold material may be indicative of the assembly of discrete fins subsequent to the application of mold material 110. For such embodiments, an empty gap or a filler of a different composition that material 110 may occupy space between fins 118 and mold material 110, and/or between adjacent fins 118. In the embodiments illustrated in FIGS. 1A and 1B, thermally conductive filler 120 is between fins 118. In some such embodiments, thermally conductive filler 120 at least partially fills one or more cavities in mold material 110. Thermally conductive filler 120 is in direct contact with mold material 110 and may also be in direct contact with fins 118, as shown. Thermally conductive filler 120 may include particles of metal combined with adhesives and/or other matrix material(s). The particles may be any size, but in some embodiments the particles have nanometer feature dimensions (e.g., nanoparticles). In some embodiments, thermally conductive filler 120 has a metal concentration of greater than 50%. In other embodiments, thermally conductive filler 120 is absent, and instead there is an air gap between fins 118 and mold material 110.

In some embodiments, each of the fins 118 is a homogeneous material. In other embodiments, each of the fins 118 comprises a combination of different materials. In some embodiments, each of the fins 118 comprises a wirebond stub. A stub is to be distinguished from an electrical wirebond as the stub may be electrically isolated from die circuitry. A stub may also lack bond wires. Stubs may include unterminated bond wires, or bond wires that are dead-ended back to device surface 114, in which case a fin may include the stub and wire. However, a stub plating process may also be employed without any subsequent wire bonding as a technique for fabricating fins of lower aspect ratio. If fins 118 are to include a bond wire, that wire may be affixed at only one end with the other end unbonded, or the wire may be terminated at a second point of device surface 114. The second point may be another hot spot, for example, or may be a cooler spot. Fins 118 may comprise a metal, such as copper, aluminum, gold, or alloys thereof. In some embodiments, fins 118 include round wire or ribbons of any gauge or diameter. In some embodiments, fins 118 may include linear rows of wirebond stubs, while in other embodiments nonlinear groupings of wirebond stubs may be utilized. While shown as being substantially orthogonal to surface 114, in some embodiments, fin array 118 may include curves or arcs non-normal to surface 114.

Figure 2A:
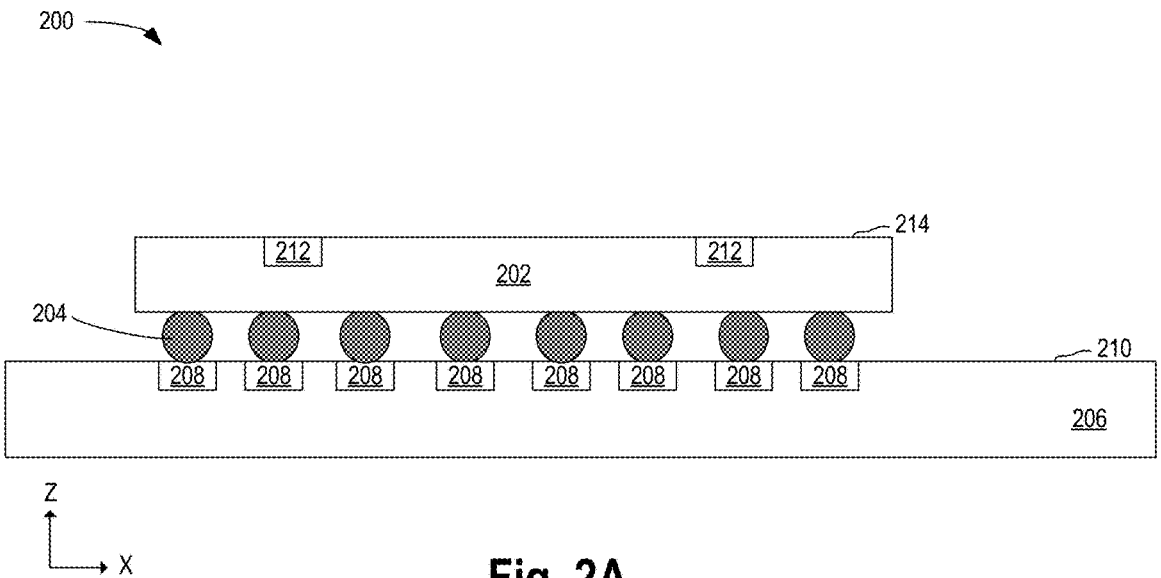
FIGS. 2A-2F illustrate cross-sectional views of a progressively formed integrated circuit device package suitable for implementing coupled cooling fins, according to some embodiments.
Figure 2B:
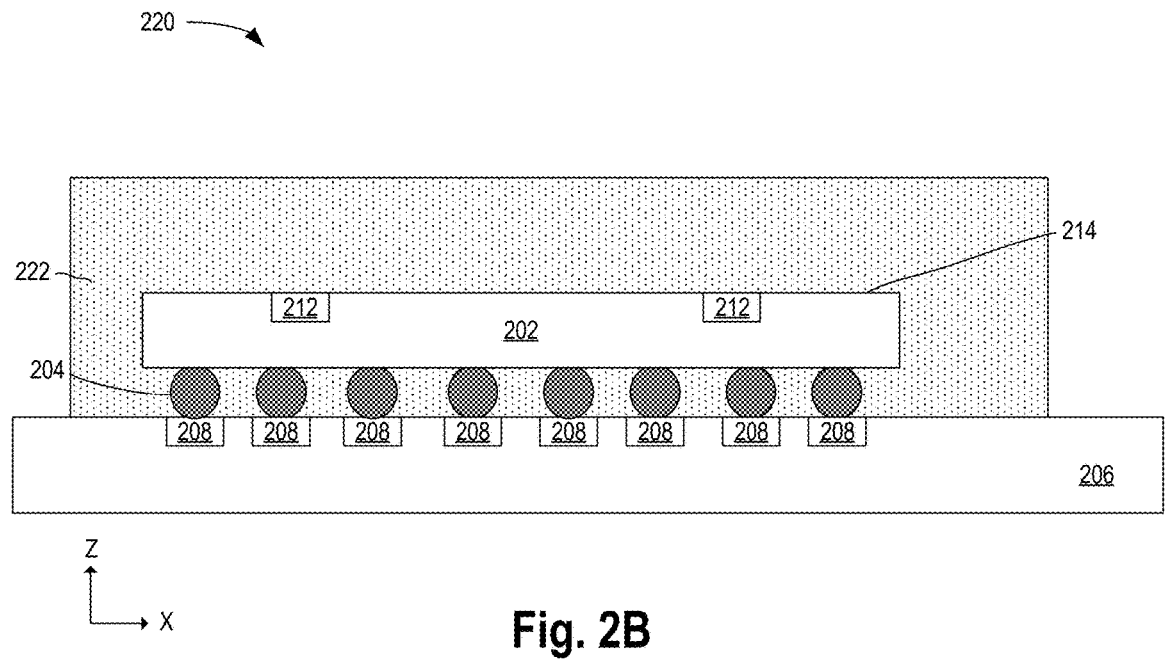

FIGS. 2A-2F illustrate cross-sectional views of a progressively formed integrated circuit device package suitable for implementing coupled cooling fins, according to some embodiments. As shown in FIG. 2A, assembly 200 includes integrated circuit device 202, device contacts 204, package substrate 206, substrate pads 208, substrate surface 210, device hotspots 212, and device surface 214. While shown as including a single integrated circuit device 202, assembly 200 may include any number of devices. Integrated circuit device 202, package substrate 206, and device hotspots 212 may have any of the attributes described elsewhere herein for integrated circuit device 102, package substrate 106, and device hotspots 112, respectively.

Turning now to FIG. 213, in assembly 220, mold material 222 has been deposited on substrate surface 210 and over integrated circuit device 202, for example with any suitable overmold process. In some embodiments, as shown in more detail hereinafter, mold material 222 may be etchable, for example through laser etching, to create openings into which thermally conductive material may be deposited in proximity to hotspots 212 on device surface 214. While shown as surrounding all sides of integrated circuit device 202, in some embodiments mold material 222 may surround less than all sides of integrated circuit device 202.

Figure 2C:
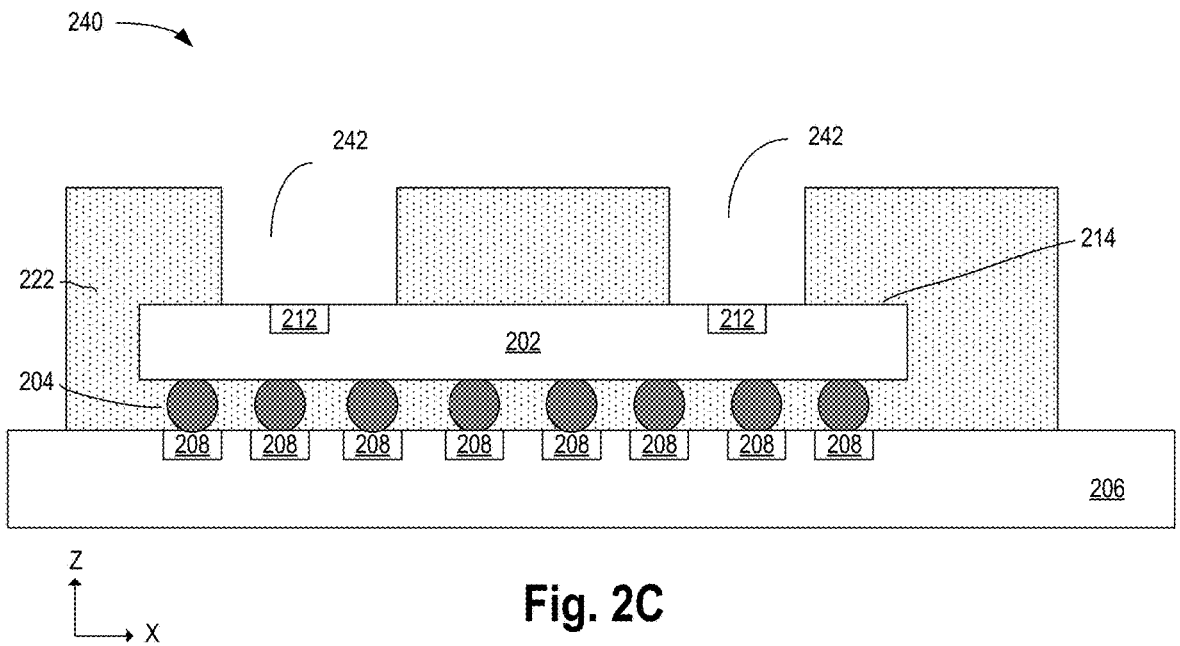

As shown in FIG. 2C, assembly 240 has had cavities 242 formed in mold material 222. In some embodiments, laser ablation or other mechanical or chemical techniques known in the art are used to selectively remove mold material 222 and expose portion of device surface 214, for example device hotspots 212.

Figure 2D:
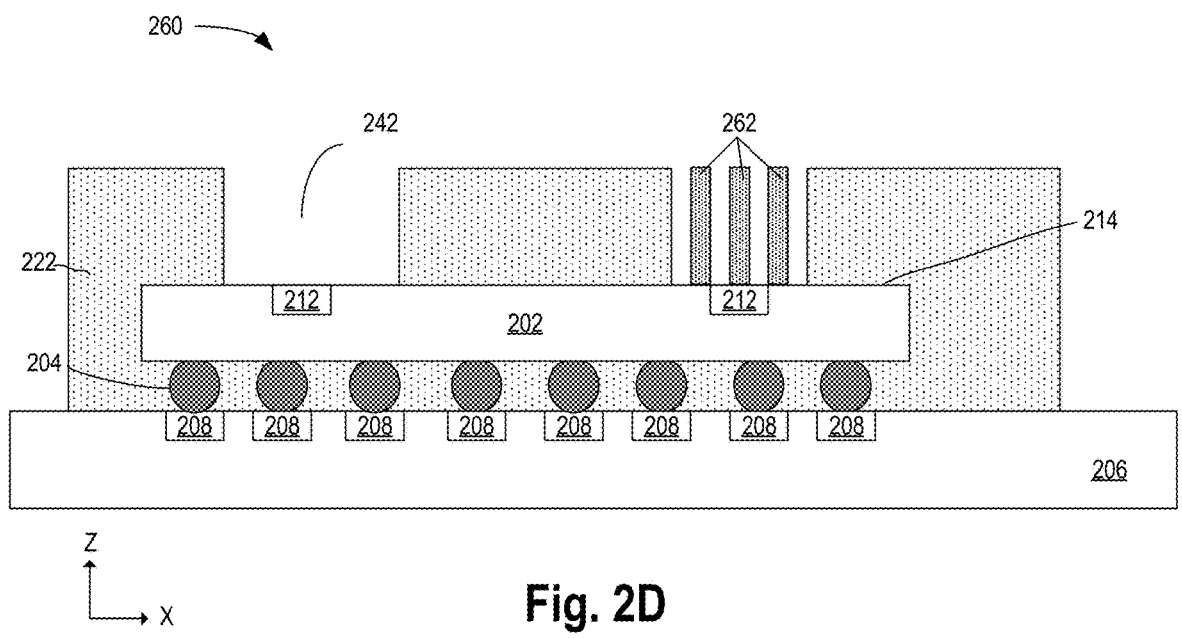

In FIG. 2D, assembly 260 includes wirebond stubs 262 in cavity 242 bonded to device surface 214. In some embodiments, at least some wirebond stubs 262 are contacting a device hotspot 212. In some embodiments, wirebond stubs 262 are plated to device surface 214 or welded to device surface 214 by ball bonding, wedge bonding, or compliant bonding, for example. While shown as being coextensive with mold material 222, in some embodiments, wirebond stubs 262 may extend orthogonally away from device surface 214 to a greater or lesser extent compared with mold material 222.

Figure 2E:
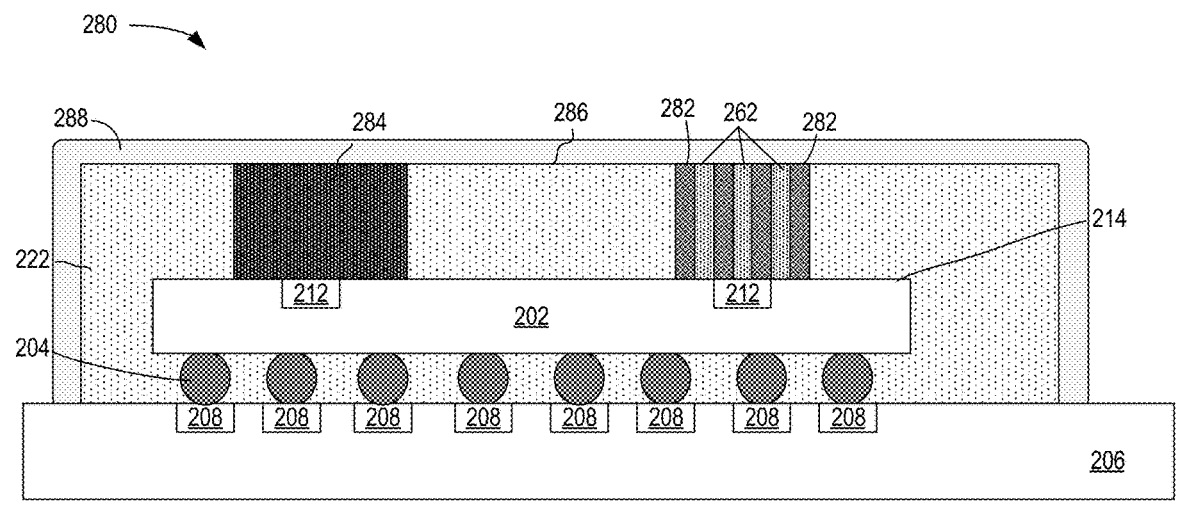

Turning now to FIG. 2E, assembly 280 includes conductive filler 282 and high thermal conductivity material 284 within cavities 242. In some embodiments, high thermal conductivity material 284 is formed by plating of metal, such as copper, through any known method including, but not limited to, electroplating that forms a cooling fin in contact with hotspot 212 and shares coplanar surface 286 with mold material 222. In some embodiments, conductive filler 282 may be deposited as a fluid amongst wirebond stubs 262 up to coplanar surface 286.

In some embodiments, thermally conductive coating 288 is deposited over coplanar surface 286 and may completely cover mold material 222. In some embodiments, thermally conductive coating 288 may be an epoxy or adhesive with metallic particles added for increased thermal conductivity. In other embodiments, thermally conductive coating 288 is a layer of metal that may be sputtered, for example, by any suitable physical vapor deposition (PVD) process.

Figure 2F:
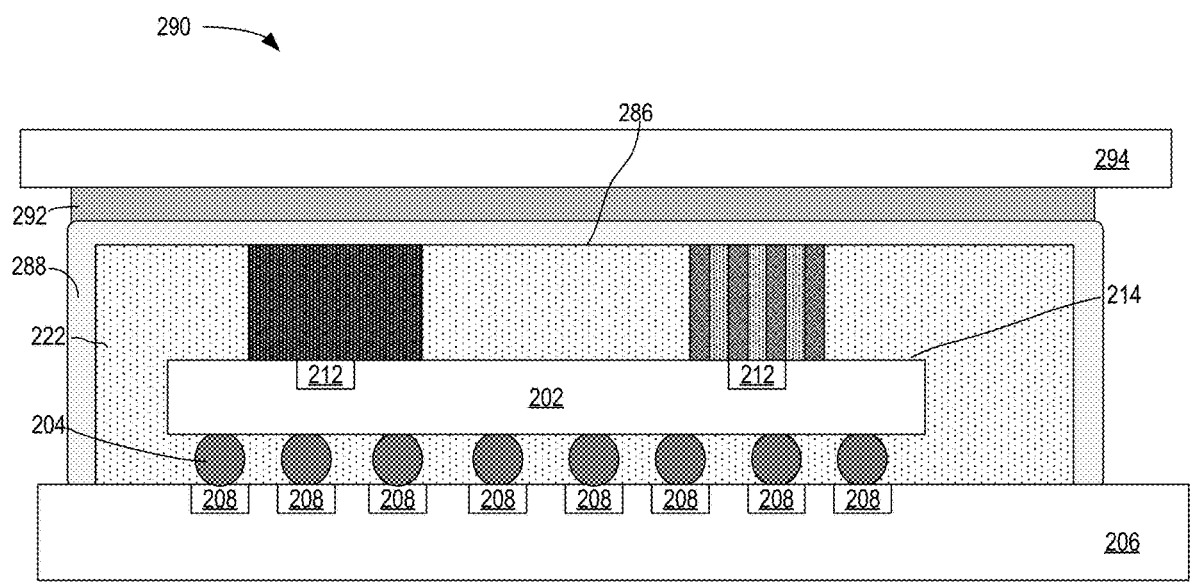

In FIG. 2F, thermal interface material 292 and heat spreader 294 have been added in assembly 290. Thermal interface material 292 may be any material known to be suitable for the purpose. In some embodiments, thermal interface material 292 has a thermal conductivity of greater than 1 watt per meter-kelvin (W/(mK)). In some examples material 292 is a solder, polymer or polymer composite, liquid metal, or phase change material. In some embodiments, thermal interface material 292 may extend beyond conductive coating 288, when present, and contact package substrate 206 as well.

Heat spreader 294 may be a metal or other thermally conductive solid material to spread heat from integrated circuit device 202. Heat spreader 294 may include fins (not shown) and may include adhesive or fasteners to further secure heat spreader 294 to package substrate 206. In some embodiments, heat spreader 294 may be a plate or block of material having high thermal conductivity, such as copper, aluminum, or diamond. In some embodiments, composite materials may be used for heat spreader 294, such as the metal matrix composites (MMCs) copper-tungsten, Al SiC (silicon carbide in aluminium matrix), Dymalloy(diamond in copper-silver alloy matrix), and E-Material (beryllium oxide in beryllium matrix).

Figure 3A:
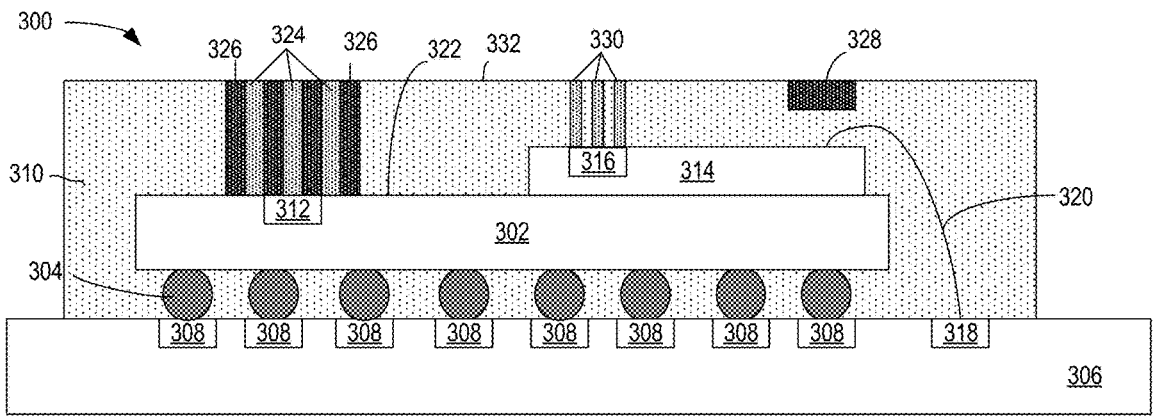
FIGS. 3A & 3B illustrate cross-sectional and overhead views, respectively, of an example integrated circuit device package with coupled cooling fins, according to some embodiments.
Figure 3B:
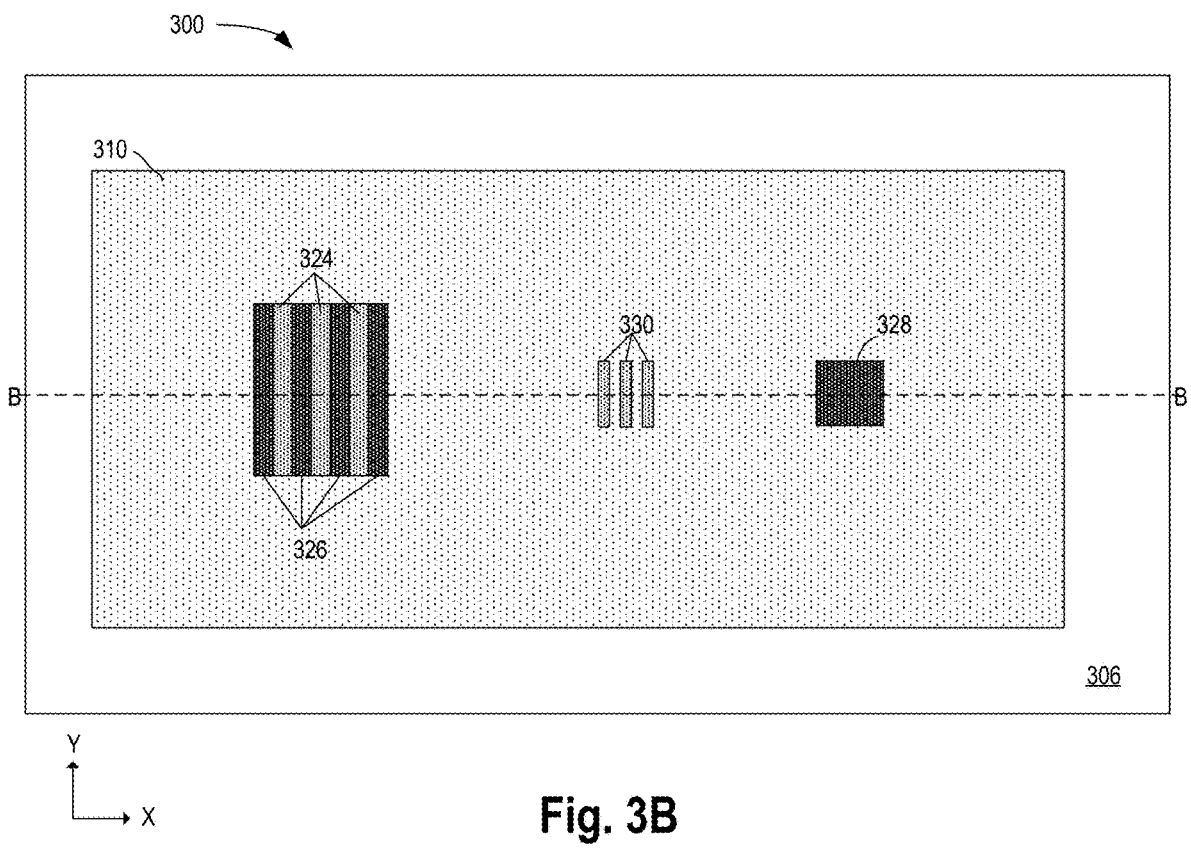

FIGS. 3A & 3B illustrate cross-sectional (viewed along cross-sectional line b-b) and overhead views, respectively, of an example integrated circuit device package with coupled cooling fins, according to some embodiments. Notably, the various fins illustrated in combination represent multiple embodiments that need not all be present within any single IC device package. As shown, package 300 includes integrated circuit device 302, device contacts 304, package substrate 306, substrate pads 308, mold material 310, device hotspot 312, stacked device 314, stacked device hotspot 316, bond pad 318, bond wire 320, device surface 322, device fins 324, high thermal conductivity material 326, stacked device fin 328, stacked device fins 330, and coplanar interface 332. In some embodiments, package 300 may represent a computing or communication device. Package 300 may be integrated as part of any type of system, including, but not limited to, a personal computing, mobile, desktop, laptop, or server system.

Integrated circuit device 302, package substrate 306, and device hotspot 312 may have any of the attributes described elsewhere herein for integrated circuit device 102, package substrate 106, and device hotspots 112, respectively.

In some embodiments, stacked device 314 may be an integrated circuit device stacked on device surface 322. In some embodiments, stacked device 314 may be a memory device, such as flash memory or synchronous dynamic random access memory (SDRAM), for example. As shown, stacked device 314 may be electrically coupled with package substrate 306 through one or more bond wires 320 in contact with bond pads 318.

In some embodiments, mold material 310 is a cured material that has been deposited between integrated circuit device 302 and package substrate 306. In some embodiments, mold material 310 is an epoxy mold material, though other mold materials may be used. Mold material 310 may extend beyond device surface 322 to varying extents. In some embodiments, mold material 310 extends beyond device surface 322 to coplanar interface 332, where the surface of mold material 310 is coplanar with one or more surfaces of high thermal conductivity material 326, fins 324 and 330, and/or stacked device fin 328. In some embodiments, mold material 310 has a thermal conductivity lower than that of high thermal conductivity material 326, fins 324 and 330, and stacked device fin 328. Stacked device fin 328 may be in contact with hotspot 312 on device surface 322.

Fins 326 are spaced apart from mold material 310 with a high thermal conductivity material 326 there between. As noted above, the presence of high thermal conductivity material 326 may be indicative of an assembly of discrete fins subsequent to application of mold material 310. In some embodiments, high thermal conductivity material 326 may have any of the attributes described elsewhere herein for thermally conductive filler 120.

Stacked device fin 328 may be the same material as high thermal conductivity material 326. Fin 328 is in direct contact with mold material 310 in substantially the same manner as material 326. In the illustrated example, stacked device fin 328 is separated from stacked device 314 by mold material 310, for example to provide clearance for bond wire 320.

While high thermal conductivity material 326 is adjacent to fins 324, fins 330 are directly embedded within mold material 310. Direct contact between a fin and mold material may be indicative of fin assembly prior to application of the mold material. Hence, while fins 330 and 324 may be of substantially the same material(s) and/or formed through substantially the same technique (e.g., wirebond stud plating and/or single-ended wirebonding), their structure within the package may differ substantially as a result of where in the assembly sequence the fin(s) are added. As such, the specific structures are often indicative of the assembly process employed to for the structures. In some embodiments, fins 324 and/or 330 may also have any of the attributes described elsewhere herein for fins 116 and/or 118.

Figure 4A:
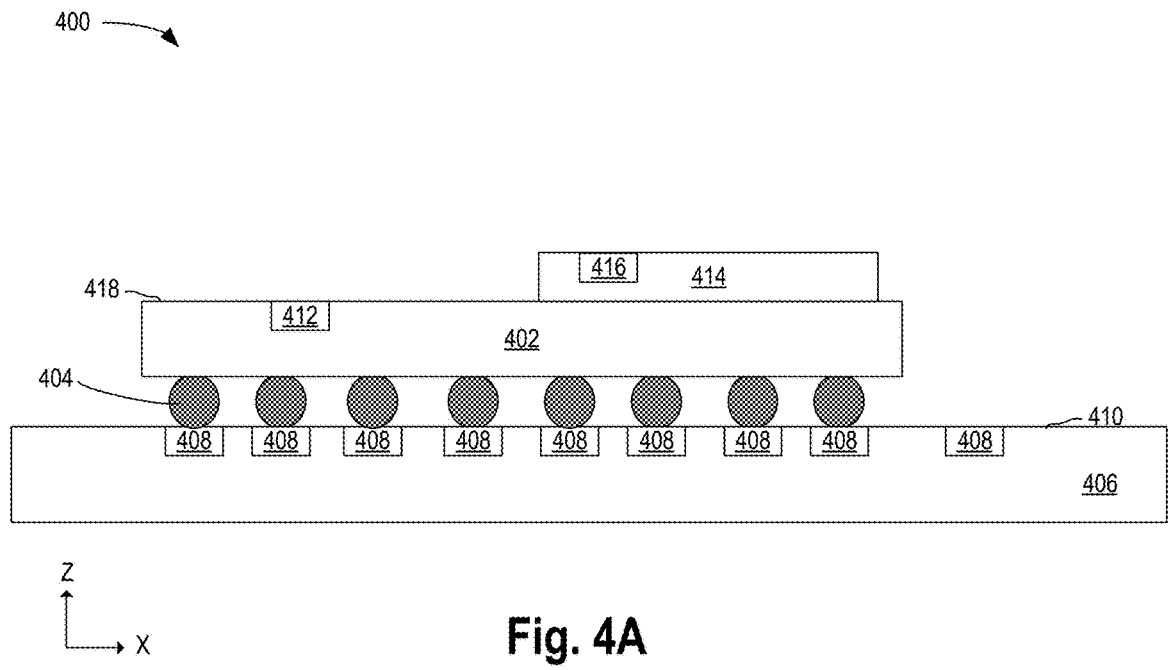
FIGS. 4A-4F illustrate cross-sectional views of a progressively formed integrated circuit device package suitable for implementing coupled cooling fins, according to some embodiments.

FIGS. 4A-4F illustrate cross-sectional views of a progressively formed integrated circuit device package suitable for implementing coupled cooling fins, according to some embodiments. As shown in FIG. 4A, assembly 400 includes integrated circuit device 402, device contacts 404, package substrate 406, substrate pads 408, substrate surface 410, device hotspot 412, stacked device 414, stacked device hotspot 416, and device surface 418. Stacked device 414 may be affixed back-to-back to device 402 according to any known technique. While shown as including a single stacked device 414 on integrated circuit device 402, assembly 400 may include any number of devices. Integrated circuit device 402, package substrate 406, and device hotspot 412 may have any of the attributes described elsewhere herein for integrated circuit device 102, package substrate 106, and device hotspots 112, respectively.

Figure 4B:
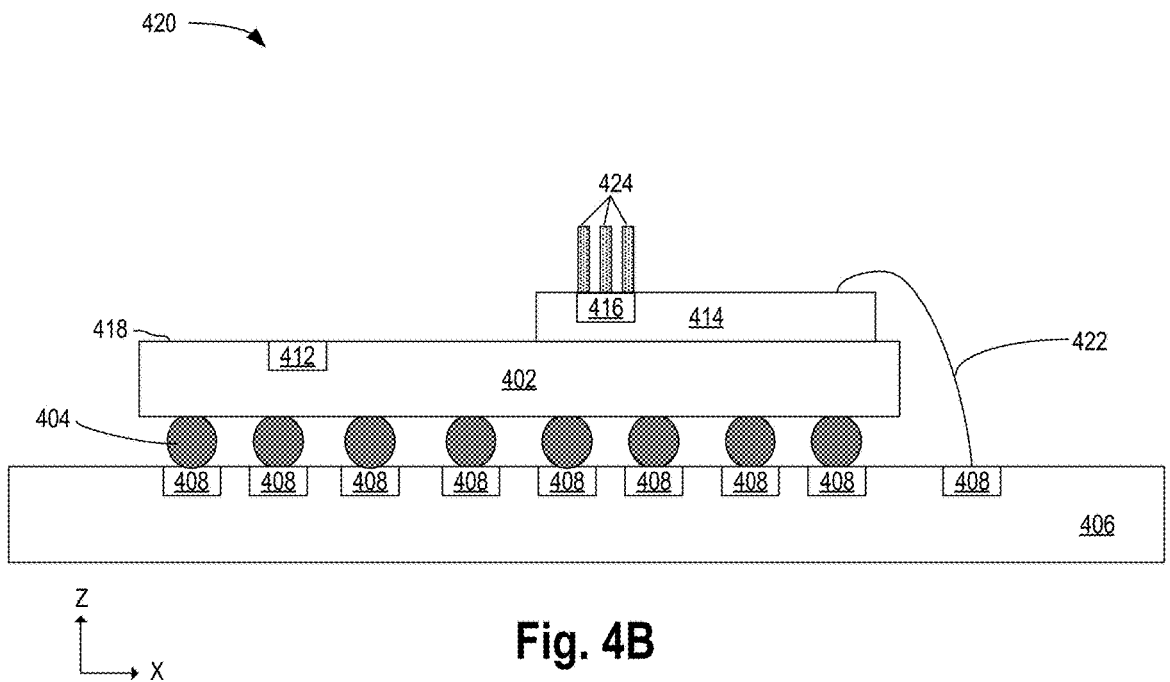

Turning now to FIG. 4B, in assembly 420, opposite ends of bond wire 422 have been affixed to stacked device 414 and substrate pad 408. Additionally, in some embodiments, wirebond stubs 424 may be affixed at one end to stacked device 414. If stubs 424 are to include a wire, that wire may be affixed at only one end with the other end unbonded, or the wire may be terminated at a second point of stacked device 414. The second point may be another hot spot (not depicted) of stacked device 414, or may be a cooler spot of stacked device 414. Being stubs, wirebond stubs 424 may be electrically isolated from IC circuitry I/Os of stack device 414, rendering them thermally coupled tins.

Figure 4C:
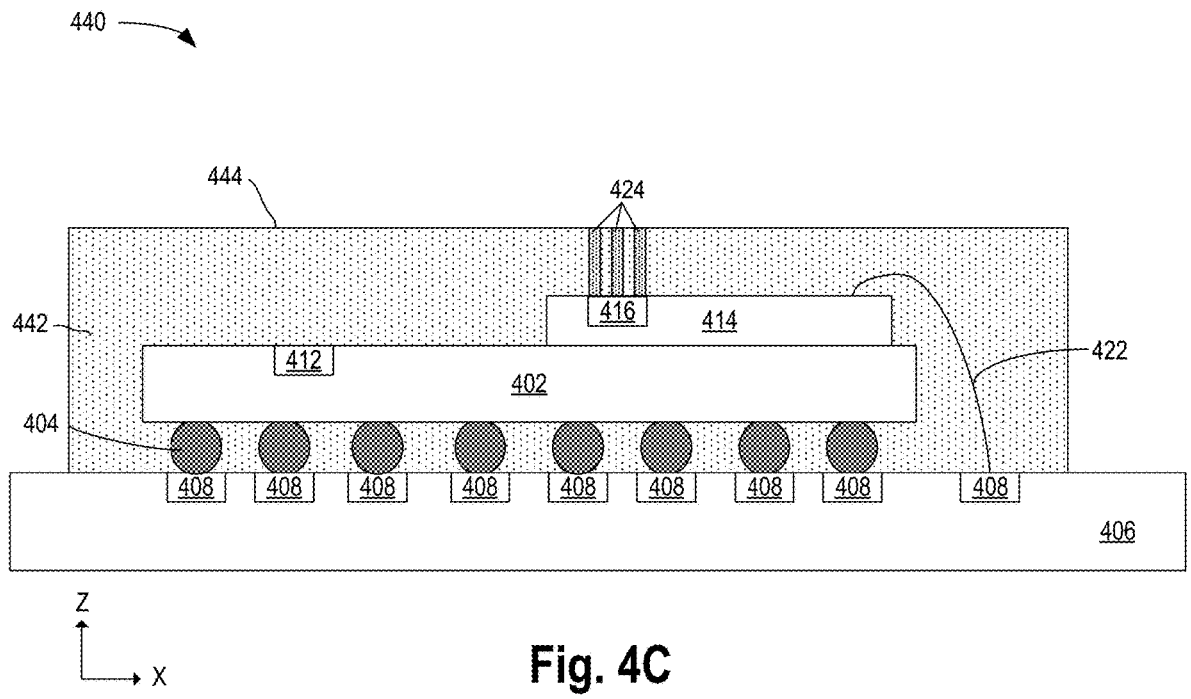

As shown in FIG. 4C, assembly 440 has had mold material 442 deposited over integrated circuit device 402 and stacked device 414. During the overmold process, mold material 442 surrounds fins 424. In some embodiments, mold material 442 extends away from stacked device 414 (e.g., in the z-dimension) to approximately the same extent as fins 424 to share a coplanar interface 444.

Figure 4D:
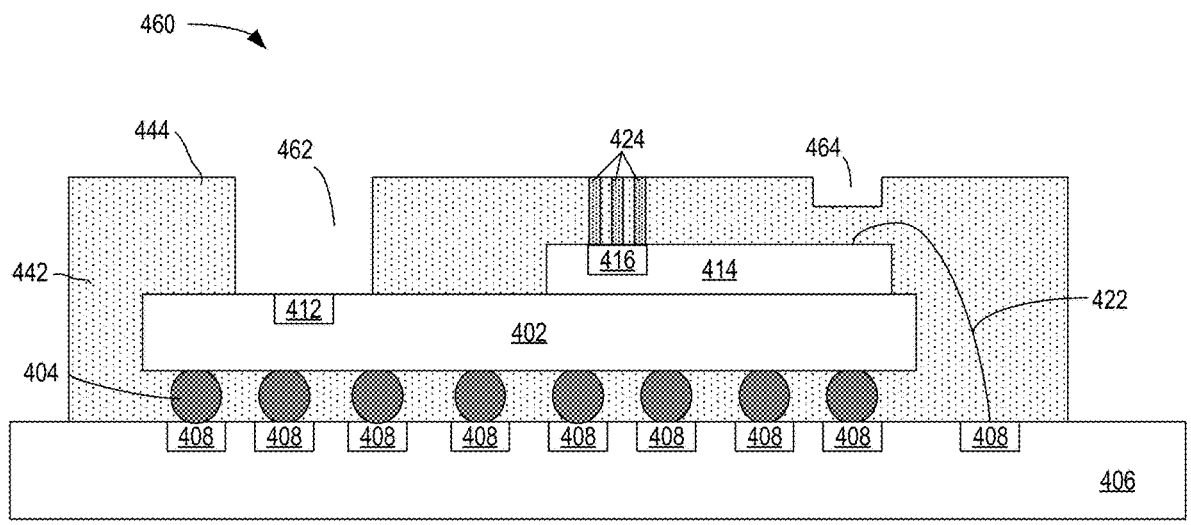

In FIG. 4D, assembly 460 includes cavities 462 and 464 in mold material 442. In some embodiments, laser ablation or other mechanical or chemical techniques known in the art are used to selectively remove mold material 442 below coplanar surface 444. Cavity 462 exposes device hotspot 412. Cavity 464 removes some portion of mold material 442, at least partially reducing its thickness over another region of stacked device 414.

Figure 4E:
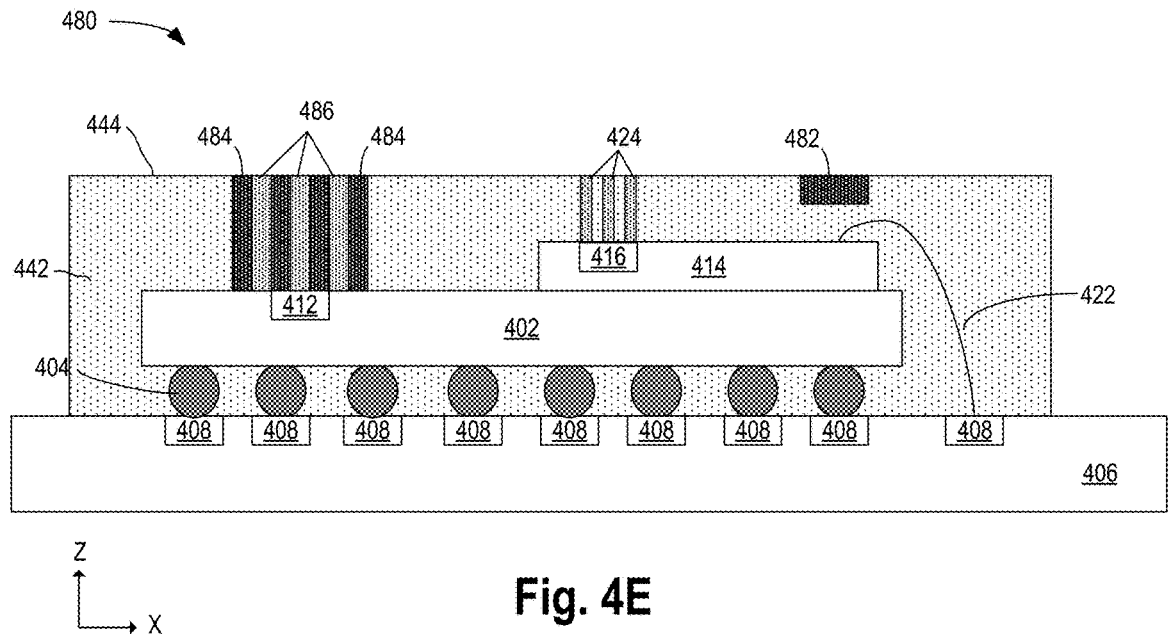

Turning now to FIG. 4E, assembly 480 includes high thermal conductivity material 484 and wirebond stubs 486 within cavity 462 and high thermal conductivity material 482 in cavity 464. In some embodiments, high thermal conductivity material 484 and 482 is plated metal, such as copper, that forms a cooling fin in contact with hotspot 412 and shares coplanar surface 444 with mold material 442.

In some embodiments, at least some wirebond stubs 486 in cavity 462 are bonded to device hotspot 412. While shown as being coextensive with mold material 442, in some embodiments, wirebond stubs 486 may extend to a greater or lesser extent compared with mold material 442.

Figure 4F:
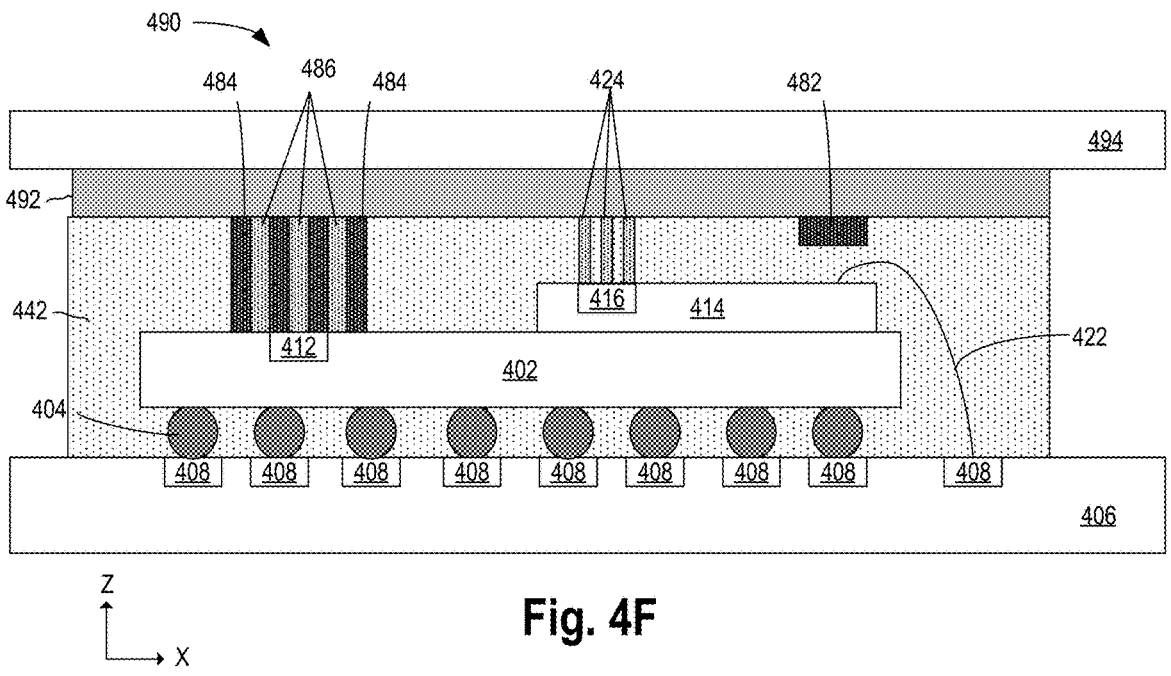

Finally, in FIG. 4F, thermal interface material 492 and heat spreader 494 have been added in assembly 490. Thermal interface material 492 may be a solder, polymer or polymer composite, liquid metal, or phase change material, for example. In some embodiments, thermal interface material 492 has a thermal conductivity of greater than 1 watt per meter-kelvin (W/(mK)). In some embodiments, thermal interface material 492 may extend beyond mold material 442, when present, and contact package substrate 406 as well.

Heat spreader 494 may be a metal or other thermally conductive solid material to spread heat from integrated circuit device 402 and stacked device 414. Heat spreader 494 may include fins (not shown) and may include adhesive or fasteners to further secure heat spreader 494 to package substrate 406. In some embodiments, heat spreader 494 may be a plate or block of material having high thermal conductivity, such as copper, aluminum, or diamond. In some embodiments, composite materials may be used for heat spreader 494, such as the metal matrix composites (MMCs) copper-tungsten, Al SiC (silicon carbide in aluminium matrix), Dymalloy(diamond in copper-silver alloy matrix), and E-Material (beryllium oxide in beryllium matrix).

Figure 5A:
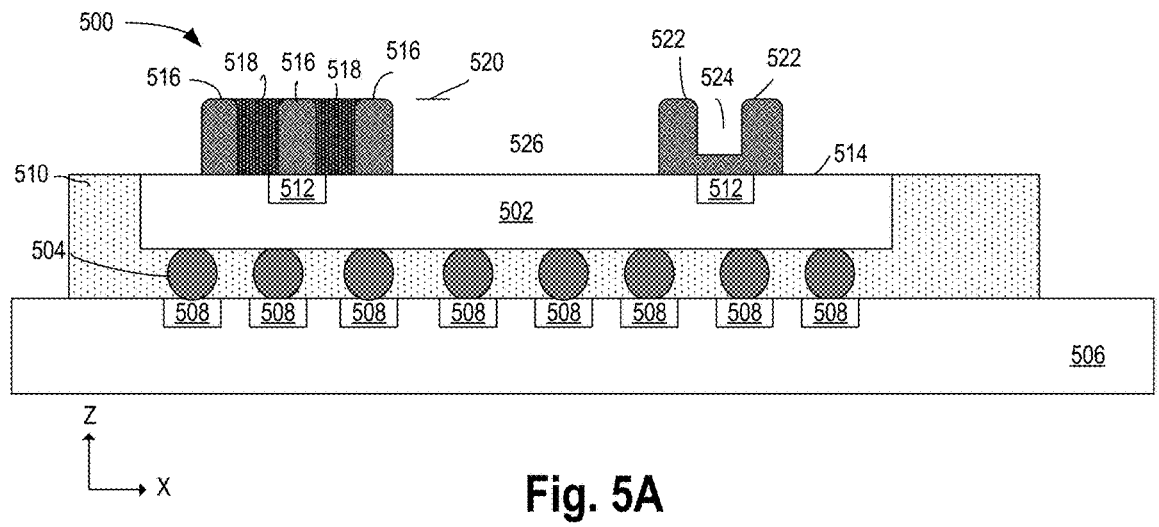
FIGS. 5A & 5B illustrate cross-sectional and overhead views, respectively, of an example integrated circuit device package with coupled cooling fins, according to some embodiments.
Figure 5B:
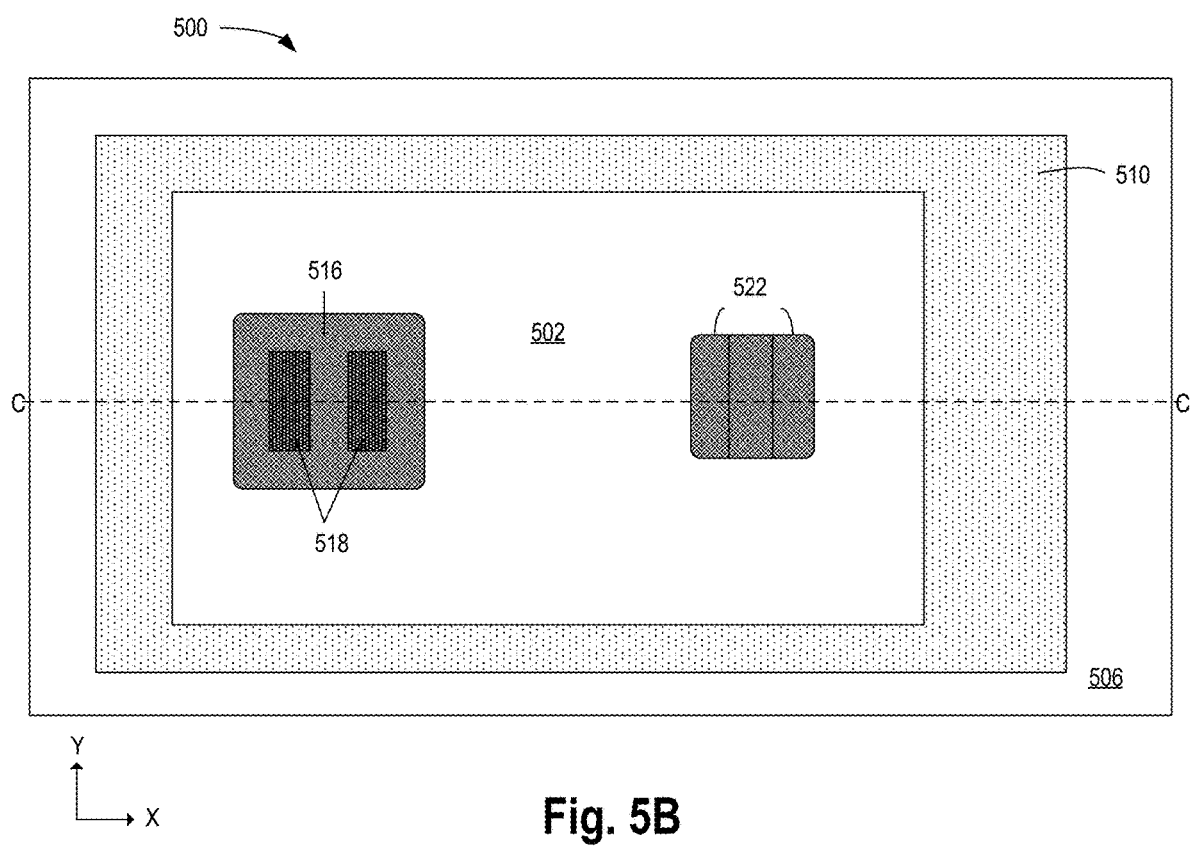

FIGS. 5A & 5B illustrate cross-sectional (viewed along cross-sectional line c-c) and overhead views, respectively, of an example integrated circuit device package with coupled cooling fins, according to some embodiments. As shown, package 500 includes integrated circuit device 502, device contacts 504, package substrate 506, substrate pads 508, mold material 510, device hotspots 512, device surface 514, thermally conductive fins 516, high thermal conductivity material 518, coplanar interface 520, thermally conductive fins 522, and air gaps 524 and 526. In some embodiments, package 500 is a computing or communication device. Package 500 may be integrated as part of any type of system, including, but not limited to, a personal computing, mobile, desktop, laptop, or server system.

Integrated circuit device 502, package substrate 506, and device hotspots 512 may have any of the attributes described elsewhere herein for integrated circuit device 102, package substrate 106, and device hotspots 112, respectively.

In some embodiments, mold material 510 is a cured material that has been deposited between integrated circuit device 502 and package substrate 506, to provide mechanical support and stability. In some embodiments, mold material 510 is an epoxy mold material, though other mold materials may be used. In some embodiments, mold material 510 may extend beyond device surface 514 to varying extents. In some embodiments, mold material 510 may extend to and is coplanar with device surface 514. In some embodiments, mold material 510 has a thermal conductivity lower than that of high thermal conductivity material 518, thermally conductive fin pattern 516 and thermally conductive ink fins 522.

In some embodiments, thermally conductive fin 516 and 522 are derived from printing with metallic ink on device surface 514. In some embodiments, thermally conductive fin 516 and 522 are a metal containing material derived from metal ink used for printing of electrical contacts for electronic circuits. In some embodiments, the metallic ink may contain a high percentage (above 50% by weight) of metal particles in combination with solvents and adhesives that evaporate and/or cure, for example when exposed to air or other drying/curing agent. In some embodiments, fins 516 and 522 are separated along device surface 514 by an air gap 526. In some embodiments, fins 522 may be coupled together along device surface 514 and separated above device surface 514 by air gap 524.

Thermally conductive material(s) may be in contact with sidewalls of a fin, or the fin may be left free-standing. In the illustrated embodiments, high thermal conductivity material 518 is a material having a thermal conductivity of greater than about 20 watts per meter-kelvin. In some embodiments, high thermal conductivity material 518 may have any of the attributes described elsewhere herein for thermally conductive filler 120.

Figure 6A:
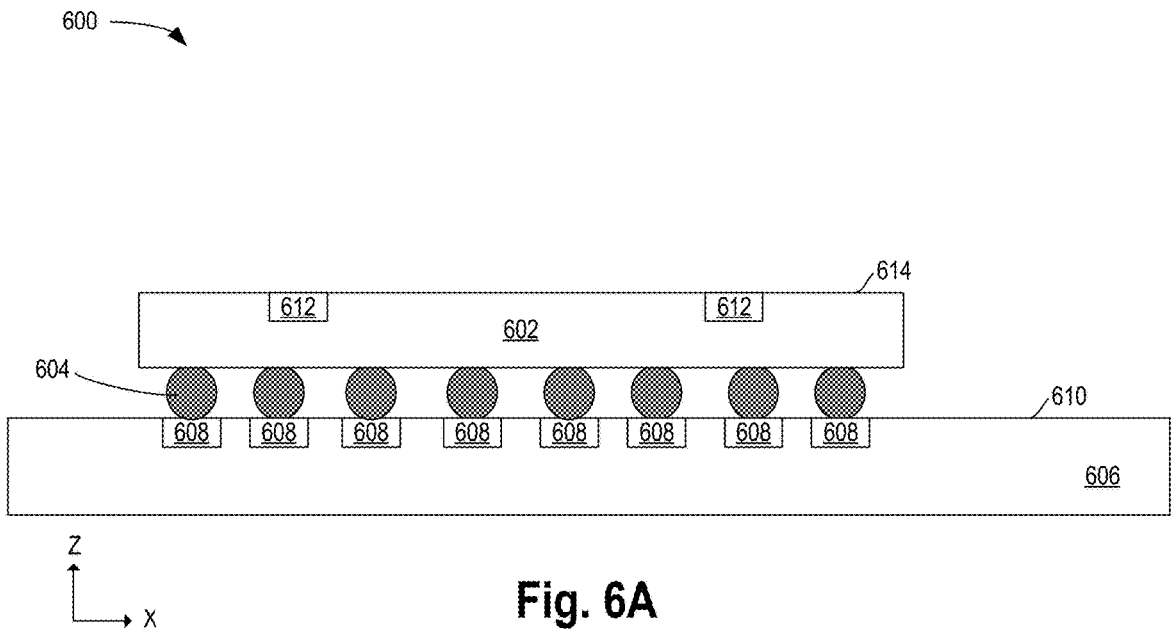
FIGS. 6A-6F illustrate cross-sectional views of a progressively formed integrated circuit device package suitable for implementing coupled cooling fins, according to some embodiments.

FIGS. 6A-6F illustrate cross-sectional views of a progressively formed integrated circuit device package suitable for implementing coupled cooling fins, according to some embodiments. As shown in FIG. 6A, assembly 600 includes integrated circuit device 602, device contacts 604, package substrate 606, substrate pads 608, substrate surface 610, device hotspots 612, and device surface 614. While shown as including a single integrated circuit device 602, assembly 600 may include any number of devices. Integrated circuit device 602, package substrate 606, and device hotspots 612 may have any of the attributes described elsewhere herein for integrated circuit device 102, package substrate 106, and device hotspots 112, respectively.

Figure 6B:
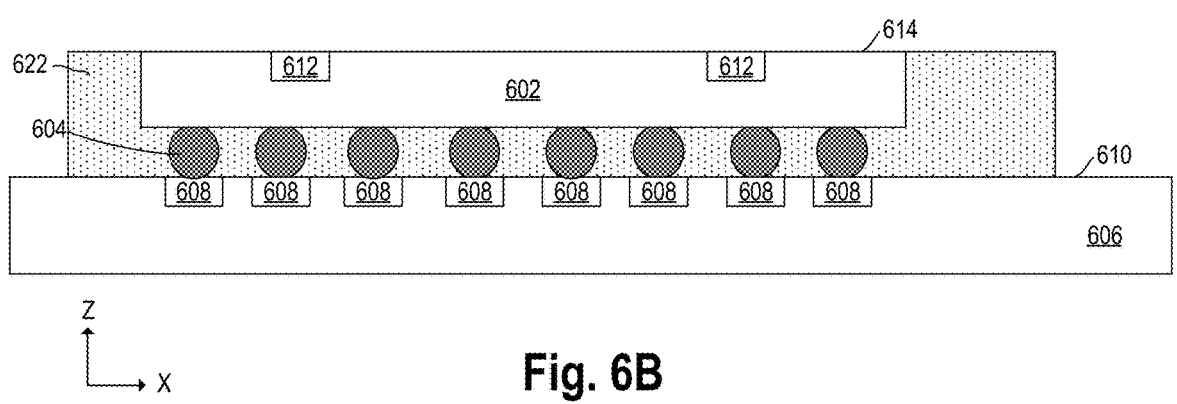

Turning now to FIG. 6B, in assembly 620, mold material 622 has been deposited on substrate surface 610 and up to device surface 614. While shown as surrounding all sides of integrated circuit device 602, in some embodiments mold material 622 may surround less than all sides of integrated circuit device 602. In some embodiments, mold material 622 may have been deposited to cover device surface 614, and then mold material 622 may have been selectively removed to expose device surface 614.

Figure 6C:
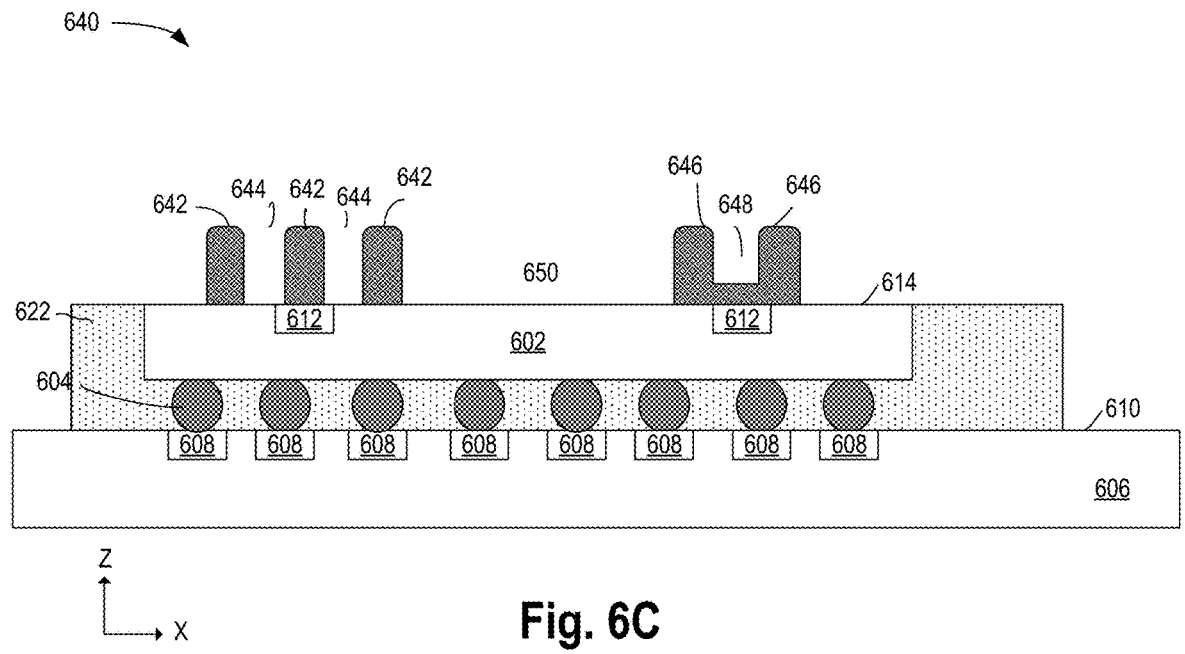

As shown in FIG. 6C, assembly 640 has had thermally conductive fin pattern 642 and thermally conductive ink fins 646 deposited in contact with device surface 614, for example device hotspots 612. In some embodiments, thermally conductive fin pattern 642 and thermally conductive ink fins 646 are printed with metallic ink. In some embodiments, thermally conductive fin pattern 642 and thermally conductive ink fins 646 may include gaps 644 and 648, respectively, which may or may not extend completely to device surface 614. In some embodiments, thermally conductive fin pattern 642 and thermally conductive ink fins 646 are separated by gap 650 along device surface 614.

Figure 6D:
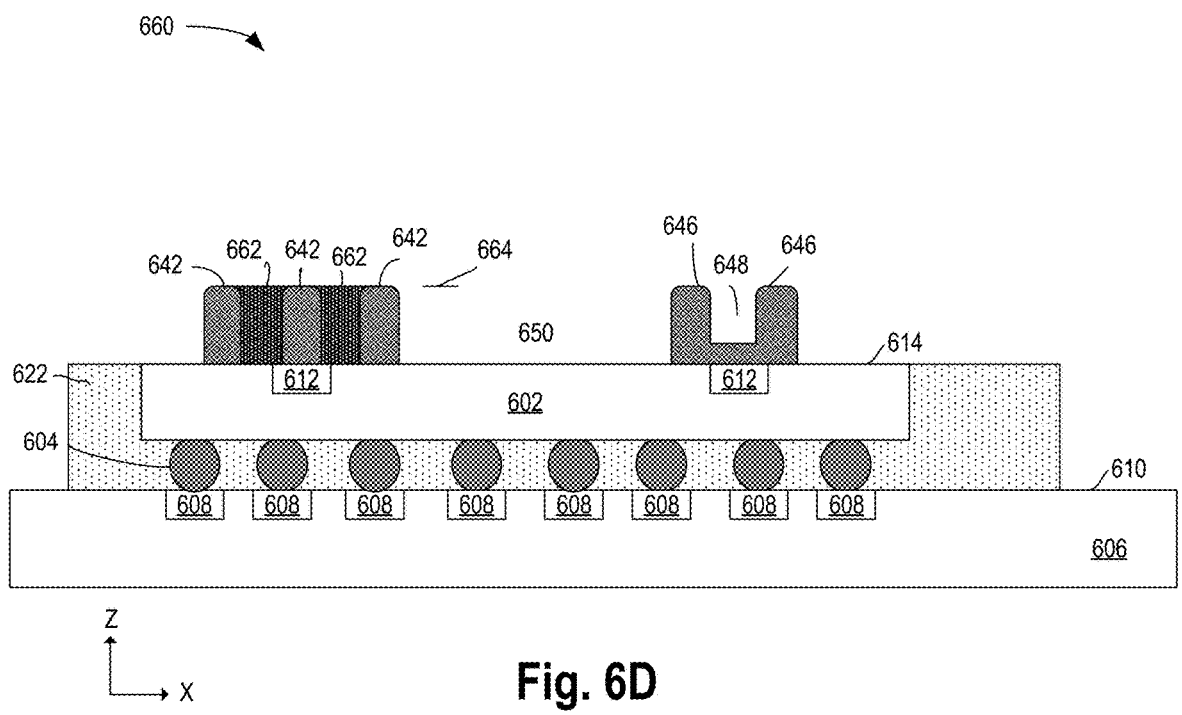

In FIG. 6D, assembly 660 includes high thermal conductivity material 662 within gaps 644. In some embodiments, high thermal conductivity material 684 is plated metal, such as copper, that forms a cooling fin in contact with hotspot 612 and shares coplanar surface 664 with thermally conductive fin pattern 642.

Figure 6E:
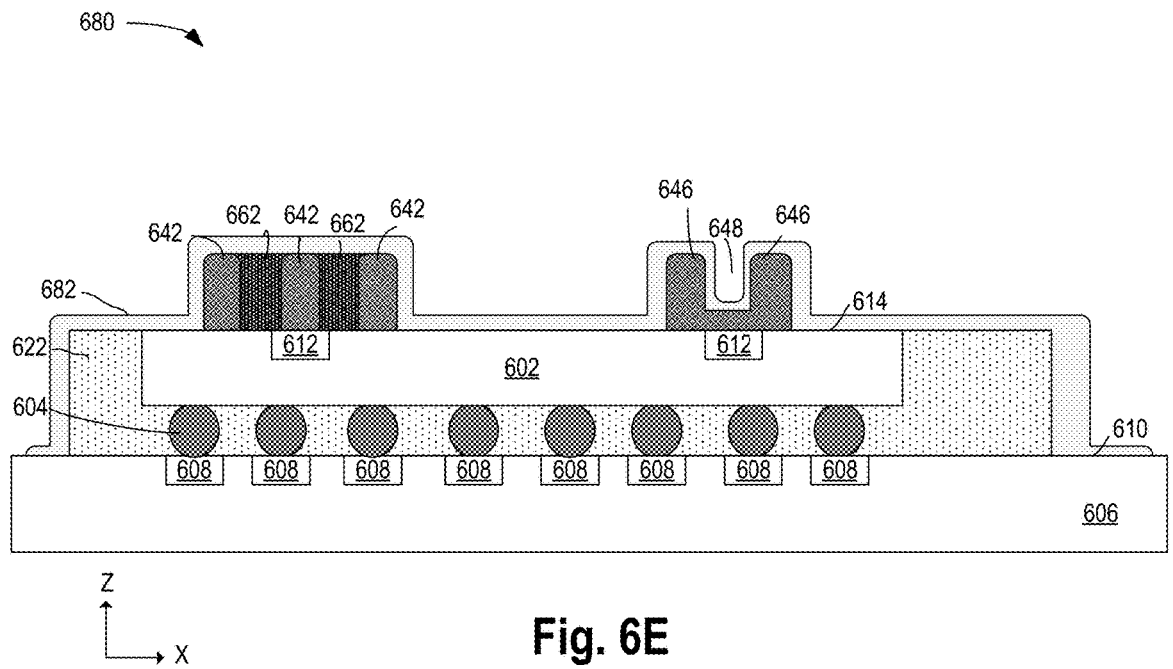

Turning now to FIG. 6E, assembly 680 may have thermally conductive coating 682 deposited over device surface 614, thermally conductive fin pattern 642, high thermal conductivity material 662, and thermally conductive ink fins 646. In some embodiments, thermally conductive coating 682 is deposited over device surface 614 and may completely cover mold material 622. In some embodiments, thermally conductive coating 682 may be an epoxy or adhesive with metallic particles added for increased thermal conductivity.

Figure 6F:
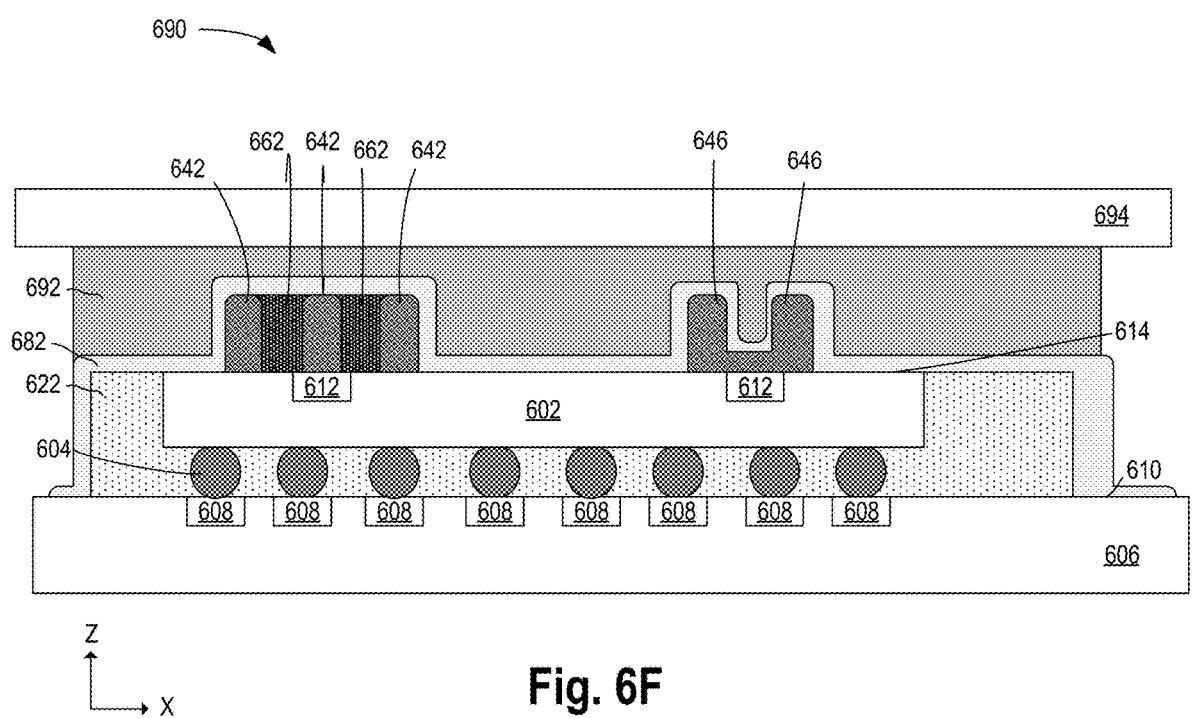

Finally, in FIG. 6F, thermal interface material 692 and heat spreader 694 have been added in assembly 690. Thermal interface material 692 may be a solder, polymer or polymer composite, liquid metal, or phase change material, for example. In some embodiments, thermal interface material 692 has a thermal conductivity of greater than 1 watt per meter-kelvin (W/(mK)). In some embodiments, thermal interface material 692 may extend beyond conductive coating 682, when present, and contact package substrate 606 as well.

Heat spreader 694 may be a metal or other thermally conductive solid material to spread heat from integrated circuit device 602. Heat spreader 694 may include fins (not shown) and may include adhesive or fasteners to further secure heat spreader 694 to package substrate 606. In some embodiments, heat spreader 694 may be a plate or block of material having high thermal conductivity, such as copper, aluminum, or diamond. In some embodiments, composite materials may be used for heat spreader 694, such as the metal matrix composites (MMCs) copper-tungsten, Al SiC (silicon carbide in aluminium matrix), Dymalloy(diamond in copper-silver alloy matrix), and E-Material (beryllium oxide in beryllium matrix).

Figure 7:
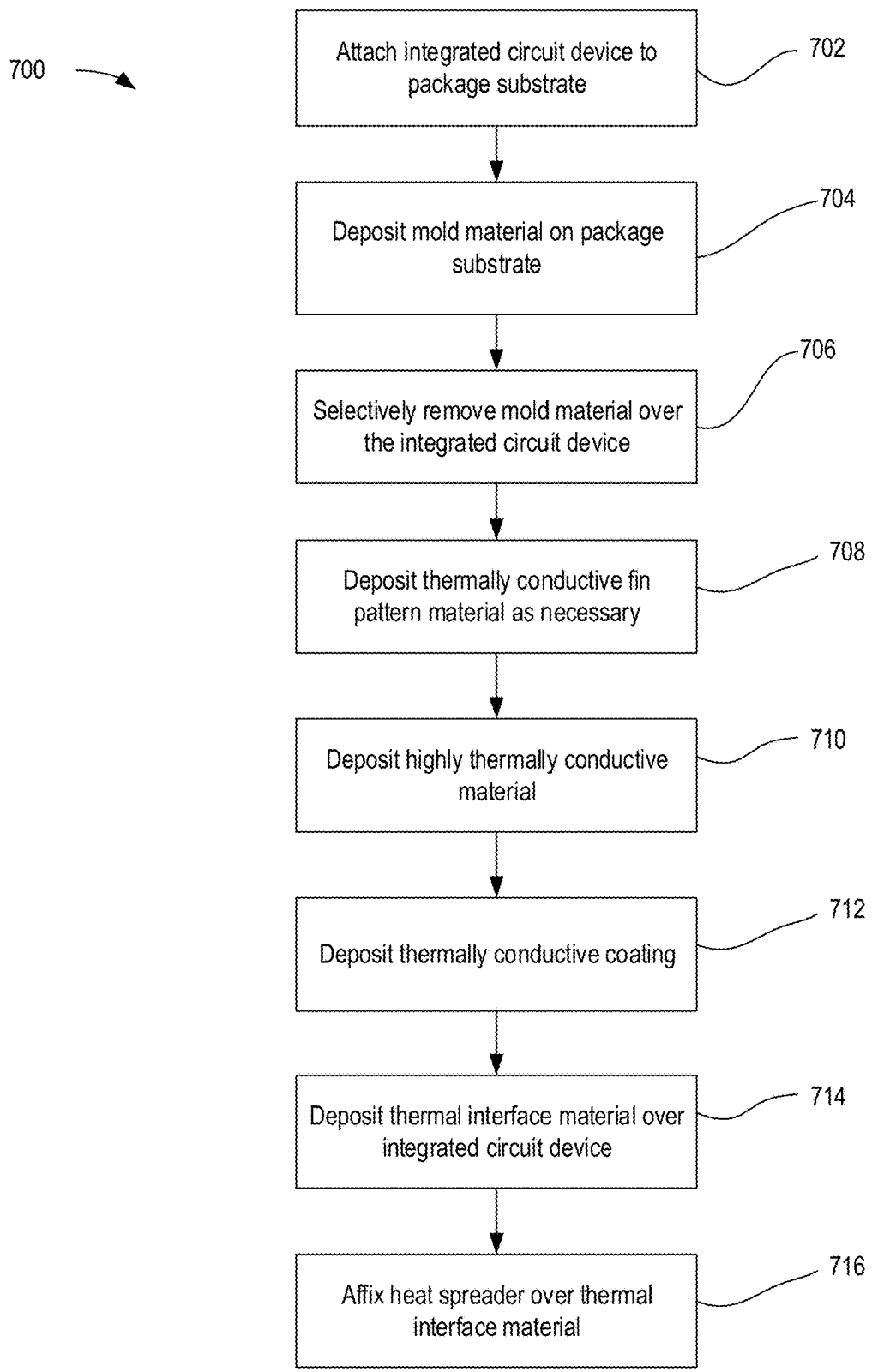
FIG. 7 illustrates a flowchart of a method of forming an integrated circuit device package with coupled cooling fins, in accordance with some embodiments.

FIG. 7 illustrates a flowchart of a method of forming an integrated circuit device package with coupled cooling fins, in accordance with some embodiments. Although the blocks in the flowchart with reference to FIG. 7 are shown in a particular order, the order of the actions can be modified. Thus, the illustrated embodiments can be performed in a different order, and some actions/blocks may be performed in parallel. Some of the blocks and/or operations listed in FIG. 7 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 700 begins with attaching (702) an integrated circuit device to a package substrate. In some embodiments, a single integrated circuit device, such as device 202, may be soldered to a package substrate. In some embodiments, multiple integrated circuit devices may be stacked, such as devices 402 and 414, and coupled with a package substrate through a combination of soldering and wirebonding. Next, mold material may be deposited (704) on the package substrate. In some embodiments, mold material, such as mold material 222, may extend above a surface of the integrated circuit device. In some embodiments, mold material, such as mold material 622, may be coplanar with a surface of the integrated circuit device.

Then, mold material may be selectively removed (706) from over the integrated circuit device. In some embodiments, removal of mold material may create a cavity, such as cavity 462 that exposes a hotspot on a surface of an integrated circuit device. In some embodiments, removal of mold material may create a cavity, such as cavity 464 that does not expose the surface of the integrated circuit device. Next, thermally conductive fin pattern material is deposited (708). In some embodiments, wirebond stubs, such as wirebond stubs 262, can form a pattern for subsequently deposited highly thermally conductive material. In some embodiments, thermally conductive metallic ink, such as thermally conductive fin pattern 642, can form a pattern for subsequently deposited highly thermally conductive material.

The method continues with depositing (710) highly thermally conductive material. In some embodiments, copper, aluminum, phase change material, or other highly thermally conductive material may be deposited in cavities in mold material, such as high thermal conductivity material 284, within patterns of thermally conductive metallic ink, such as high thermal conductivity material 662, or amongst wirebond stubs, such as high thermal conductivity material 484. Then, a thermally conductive coating may be deposited (712) over the cooling fins and structures on the surface of the integrated circuit device. In some embodiments, thermally conductive coating 682 may cover exposed portions of device surface 614. In some embodiments, thermally conductive coating 288 may completely cover mold material 222.

Next, thermal interface material may be deposited (714) over the integrated circuit device. In some embodiments, thermal interface material, such as thermal interface material 692, may fill in air gaps between cooling fins. In some embodiments, thermal interface material, such as thermal interface material 492, may contact a coplanar interface of cooling fins and mold material. Finally, a heat spreader is affixed (716) over the thermal interface material. In some embodiments, a heat spreader, such as heat spreader 494, may be a block of metal or composite material.

Figure 8:
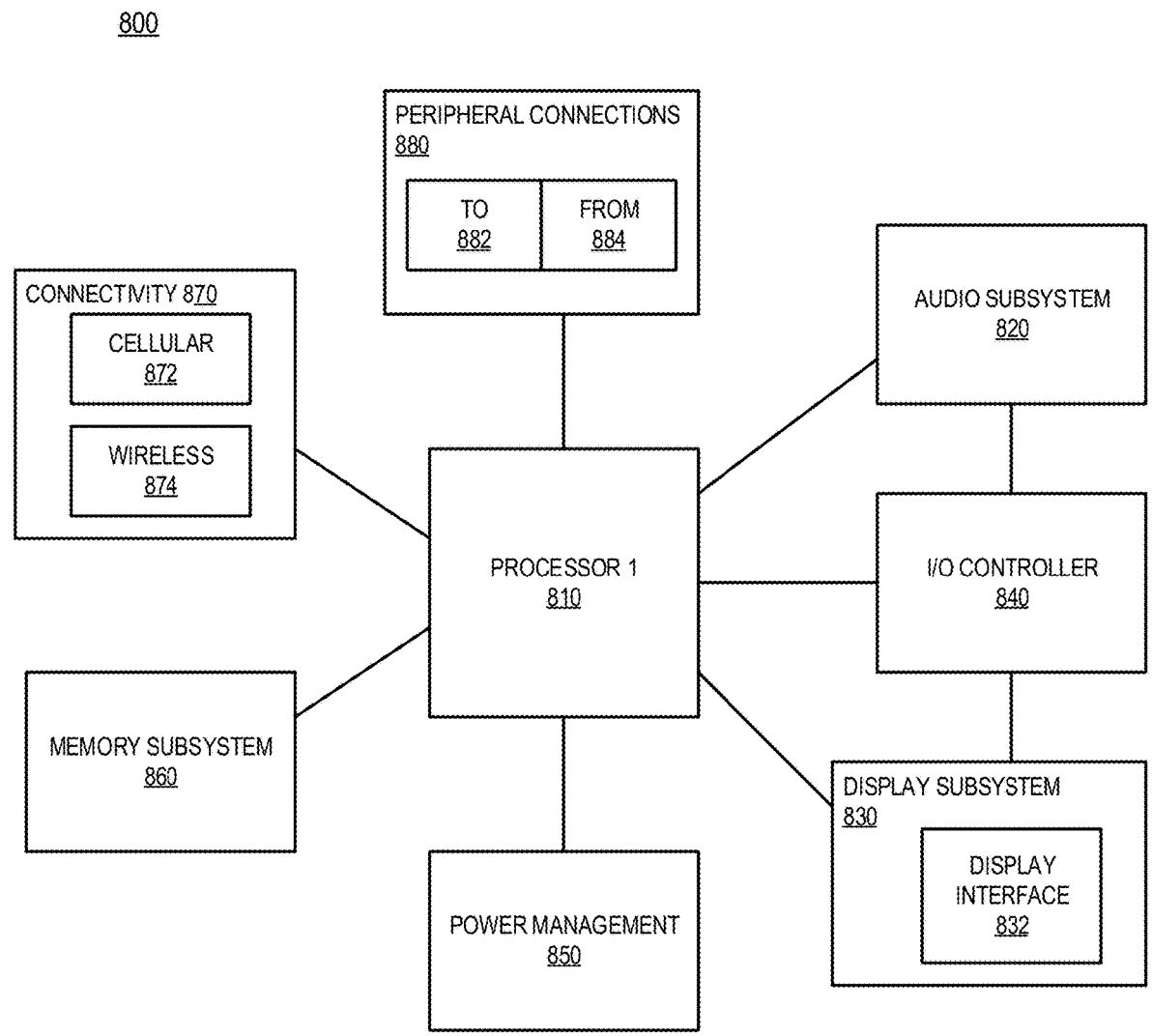
FIG. 8 illustrates a smart device or a computer system or a SoC (System-on-Chip) which includes an integrated circuit device package with coupled cooling fins, according to some embodiments.

FIG. 8 illustrates a smart device or a computer system or a SoC (System-on-Chip) 800 which includes an integrated circuit device package with coupled cooling fins, according to some embodiments. In some embodiments, computing device 800 represents a mobile computing device, such as a computing tablet, a mobile phone or smart-phone, a wireless-enabled e-reader, or other wireless mobile device. It will be understood that certain components are shown generally, and not all components of such a device are shown in computing device 800. In some embodiments, one or more components of computing device 800, for example processor 810 and/or connectivity 870, include a package with coupled cooling fins as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors—BJT PNP/NPN, BiCMOS, CMOS, etc., may be used without departing from the scope of the disclosure.

In some embodiments, computing device 800 includes a first processor 810. The various embodiments of the present disclosure may also comprise a network interface within 870 such as a wireless interface so that a system embodiment may be incorporated into a wireless device, for example, cell phone or personal digital assistant.

In one embodiment, processor 810 can include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting the computing device 800 to another device. The processing operations may also include operations related to audio I/O and/or display I/O.

In one embodiment, computing device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 800, or connected to the computing device 800. In one embodiment, a user interacts with the computing device 800 by providing audio commands that are received and processed by processor 810.

Display subsystem 830 represents hardware (e.g., display devices) and software (e.g., drivers) components that provide a visual and/or tactile display for a user to interact with the computing device 800. Display subsystem 830 includes display interface 832, which includes the particular screen or hardware device used to provide a display to a user. In one embodiment, display interface 832 includes logic separate from processor 810 to perform at least some processing related to the display. In one embodiment, display subsystem 830 includes a touch screen (or touch pad) device that provides both output and input to a user.

I/O controller 840 represents hardware devices and software components related to interaction with a user. I/O controller 840 is operable to manage hardware that is part of audio subsystem 820 and/or display subsystem 830. Additionally, I/O controller 840 illustrates a connection point for additional devices that connect to computing device 800 through which a user might interact with the system. For example, devices that can be attached to the computing device 800 might include microphone devices, speaker or stereo systems, video systems or other display devices, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of the computing device 800. Additionally, audio output can be provided instead of, or in addition to display output. In another example, if display subsystem 830 includes a touch screen, the display device also acts as an input device, which can be at least partially managed by I/O controller 840. There can also be additional buttons or switches on the computing device 800 to provide I/O functions managed by I/O controller 840.

In one embodiment, I/O controller 840 manages devices such as accelerometers, cameras, light sensors or other environmental sensors, or other hardware that can be included in the computing device 800. The input can be part of direct user interaction, as well as providing environmental input to the system to influence its operations (such as filtering for noise, adjusting displays for brightness detection, applying a flash for a camera, or other features).

In one embodiment, computing device 800 includes power management 850 that manages battery power usage, charging of the battery, and features related to power saving operation. Memory subsystem 860 includes memory devices for storing information in computing device 800. Memory can include nonvolatile (state does not change if power to the memory device is interrupted) and/or volatile (state is indeterminate if power to the memory device is interrupted) memory devices. Memory subsystem 860 can store application data, user data, music, photos, documents, or other data, as well as system data (whether long-term or temporary) related to the execution of the applications and functions of the computing device 800.

Elements of embodiments are also provided as a machine-readable medium (e.g., memory 860) for storing the computer-executable instructions. The machine-readable medium (e.g., memory 860) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 870 includes hardware devices (e.g., wireless and/or wired connectors and communication hardware) and software components (e.g., drivers, protocol stacks) to enable the computing device 800 to communicate with external devices. The computing device 800 could be separate devices, such as other computing devices, wireless access points or base stations, as well as peripherals such as headsets, printers, or other devices.

Connectivity 870 can include multiple different types of connectivity. To generalize, the computing device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 874 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 880 include hardware interfaces and connectors, as well as software components (e.g., drivers, protocol stacks) to make peripheral connections. It will be understood that the computing device 800 could be both a peripheral device ("to" 882) to other computing devices, as well as have peripheral devices ("from" 884) connected to it. The computing device 800 commonly has a "docking" connector to connect to other computing devices for purposes such as managing (e.g., downloading and/or uploading, changing, synchronizing) content on computing device 800. Additionally, a docking connector can allow computing device 800 to connect to certain peripherals that allow the computing device 800 to control content output, for example, to audiovisual or other systems.

In addition to a proprietary docking connector or other proprietary connection hardware, the computing device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In first examples, an integrated circuit device apparatus comprises a package substrate, an integrated circuit device coupled to a surface of the package substrate, a first material on the surface of the package substrate, the first material contacting one or more lateral sides of the integrated circuit device, the first material extending at least to a surface of the integrated circuit device opposite the package substrate, two or more separate fins over a surface of the integrated circuit device, the two or more fins comprising a second material having a different composition than the first material, and a third material having a different composition than the second material, the third material over the surface of the integrated circuit device and between the two or more fins.

In second examples, for any of the first examples, the second material has a higher thermal conductivity than the first material.

In third examples, for any of the first examples, the third material opposite the integrated circuit device is coplanar with a surface of the second material opposite the integrated circuit device.

In fourth examples, for any of the first examples, the first material has an interface opposite the surface of the integrated circuit device coplanar with interfaces of the two or more fins.

In fifth examples, for any of the first examples, the third material has a different composition than the first material.

In sixth examples, for any of the first examples, further comprising an air gap between the two or more fins.

In seventh examples, for any of the first examples, the fins comprise metallic nanoparticles and cured adhesive.

In eighth examples, for any of the first examples, the fins comprise wirebond stubs.

In ninth examples, for any of the first examples, the fins comprise at least one of: copper, aluminum, or phase change material.

In tenth examples, for any of the first examples, the two or more fins are directly in contact with locations on the surface of the integrated circuit device associated with relatively higher heat production.

In eleventh examples, for any of the first examples, further comprising a thermally conductive coating over the two or more fins and the third material.

In twelfth examples, for any of the first examples, further comprising a memory device coupled with the surface of the integrated circuit device.

In thirteenth examples, for any of the twelfth examples, further comprising a fin over the memory device, the fin over the memory device having an interface coplanar with interfaces of the two or more fins.

In fourteenth examples, for any of the thirteenth examples, the fin over the memory device is separated from the memory device by the first material.

In fifteenth examples, an integrated circuit device package comprises a package substrate, an integrated circuit device coupled with contacts on a surface of the package substrate, mold material on the surface of the package substrate, the mold material contacting one or more lateral sides of the integrated circuit device, the mold material extending at least to a surface of the integrated circuit device opposite the package substrate, two or more separate fins directly on the surface of the integrated circuit device, the two or more fins comprising highly thermally conductive material, fin pattern material directly on the surface of the integrated circuit device adjacent the two or more fins, the fin pattern material comprising material having a lower thermal conductivity than that of the two or more fins, thermal interface material over the fins and fin pattern material, and a heat spreader in contact with the thermal interface material.

In sixteenth examples, for any of the fifteenth examples, the two or more fins are directly in contact with locations on the surface of the integrated circuit device associated with relatively higher heat production.

In seventeenth examples, for any of the fifteenth examples, the fin pattern material is the mold material.

In eighteenth examples, for any of the fifteenth examples, the fin pattern material comprises metallic ink.

In nineteenth examples, for any of the fifteenth examples, the two or more fins comprise one or more of: copper, aluminum, or phase change material.

In twentieth examples, a computing system comprises a system board, a memory coupled with the system board, and an integrated circuit device package coupled with the system board, the integrated circuit device package comprising: a package substrate, an integrated circuit device coupled with contacts on a surface of the package substrate, mold material on the surface of the package substrate, the mold material contacting one or more lateral sides of the integrated circuit device, the mold material extending at least to a surface of the integrated circuit device opposite the package substrate, two or more separate fins directly on the surface of the integrated circuit device, the two or more fins comprising highly thermally conductive material, and fin pattern material directly on the surface of the integrated circuit device adjacent the two or more fins, the fin pattern material comprising material having a lower thermal conductivity than that of the two or more fins.

In twenty-first examples, for any of the twentieth examples, the two or more fins are directly in contact with locations on the surface of the integrated circuit device associated with relatively higher heat production.

In twenty-second examples, for any of the twentieth examples, the mold material extends beyond the surface of the integrated circuit device to a surface coplanar with surfaces of the two or more fins.

In twenty-third examples, for any of the twentieth examples, the fin pattern material comprises wirebond stubs.

In twenty-fourth examples, for any of the twentieth examples, the two or more fins comprise one or more of: copper, aluminum, or phase change material.

In twenty-fifth examples, a method of manufacturing an integrated circuit device package comprises attaching an integrated circuit device to a package substrate, depositing mold material on the package substrate, selectively removing mold material over the integrated circuit device, depositing a first thermally conductive material on a surface of the integrated circuit device, and depositing a second thermally conductive material on the surface of the integrated circuit device to form two or more separate fins.

In twenty-sixth examples, for any of the twenty-fifth examples, depositing a second thermally conductive material on the surface of the integrated circuit device to form two or more separate fins comprises attaching rows of wirebond stubs to the surface of the integrated circuit device.

In twenty-seventh examples, for any of the twenty-fifth examples, depositing a second thermally conductive material on the surface of the integrated circuit device to form two or more separate fins comprises depositing metal within a pattern formed by the first thermally conductive material.

In twenty-eighth examples, for any of the twenty-fifth examples, depositing a second thermally conductive material on the surface of the integrated circuit device to form two or more separate fins comprises depositing metallic ink on the surface of the integrated circuit device.

In twenty-ninth examples, for any of the twenty-fifth examples, depositing mold material on the package substrate and selectively removing mold material over the integrated circuit device comprises depositing mold material on the package substrate to a height above the integrated circuit device surface and removing mold material to expose locations on the integrated circuit device surface associated with relatively higher heat production.

In thirtieth examples, for any of the twenty-ninth examples, depositing a first thermally conductive material on a surface of the integrated circuit device comprising depositing high thermal conductively material coplanar with the mold material.

In thirty-first examples, for any of the twenty-fifth examples, depositing a first thermally conductive material on a surface of the integrated circuit device comprising depositing metallic ink on the surface of the integrated circuit device to form a fin pattern.

In thirty-second examples, for any of the thirty-first examples, depositing a second thermally conductive material on the surface of the integrated circuit device to form two or more separate fins comprises depositing metal within a pattern formed by the metallic ink.

In thirty-third examples, for any of the twenty-fifth examples, further comprising depositing a thermally conductive coating over the first thermally conductive material and the two or more separate fins.

In thirty-fourth examples, for any of the twenty-fifth examples, further comprising depositing thermal interface material over the first thermally conductive material and the two or more separate fins.

In thirty-fifth examples, an apparatus formed by any of twenty-fifth through thirty-fourth examples.

In thirty-sixth examples, an integrated circuit device package comprises a package substrate, an integrated circuit device coupled with contacts on a surface of the package substrate, means for insulating on the surface of the package substrate, the insulating means contacting one or more lateral sides of the integrated circuit device, the insulating means extending at least to a surface of the integrated circuit device opposite the package substrate, two or more separate fins directly on the surface of the integrated circuit device, the two or more fins comprising highly thermally conductive material, means for patterning a fin directly on the surface of the integrated circuit device adjacent the two or more fins, the patterning means comprising material having a lower thermal conductivity than that of the two or more fins, thermal interface material over the fins and patterning means, and a heat spreader in contact with the thermal interface material.

In thirty-seventh examples, for any of the thirty-sixth examples, the two or more fins are directly in contact with locations on the surface of the integrated circuit device associated with relatively higher heat production.

In thirty-eighth examples, for any of the thirty-sixth examples, the patterning means is the insulating means.

In thirty-ninth examples, for any of the thirty-sixth through thirty-eighth examples, the patterning means comprises metallic ink.

In fortieth examples, for any of the thirty-sixth through thirty-eighth examples, the two or more fins comprise one or more of: copper, aluminum, or phase change material.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a package substrate;
    an integrated circuit device coupled to a surface of the package substrate;
    a first material on the surface of the package substrate, the first material contacting one or more lateral sides of the integrated circuit device, the first material extending at least to a surface of the integrated circuit device opposite the package substrate;
    two or more separate fins over a surface of the integrated circuit device, the two or more fins comprising a second material having a different composition than the first material, wherein the fins comprise metallic nanoparticles and cured adhesive; and
    a third material having a different composition than the second material, the third material over the surface of the integrated circuit device and between the two or more fins.

2. The apparatus of claim 1, wherein the second material has a higher thermal conductivity than the first material.

3. The apparatus of claim 1, wherein the third material opposite the integrated circuit device is coplanar with a surface of the second material opposite the integrated circuit device.

4. The apparatus of claim 1, wherein the first material has an interface opposite the surface of the integrated circuit device coplanar with interfaces of the two or more fins.

5. The apparatus of claim 1, wherein the third material has a different composition than the first material.

6. The apparatus of claim 1, further comprising an air gap between the two or more fins.

7. The apparatus of claim 1 wherein the fins comprise wirebond stubs.

8. The apparatus of claim 1 wherein the fins comprise at least one of: copper, aluminum, or phase change material.

9. The apparatus of claim 1 wherein the two or more fins are directly in contact with locations on the surface of the integrated circuit device associated with relatively higher heat production.

10. The apparatus of claim 1, further comprising a thermally conductive coating over the two or more fins and the third material.

11. The apparatus of claim 1, further comprising a memory device coupled with the surface of the integrated circuit device.

12. The apparatus of claim 11, further comprising a fin over the memory device, the fin over the memory device having an interface coplanar with interfaces of the two or more fins.

13. The apparatus of claim 12, wherein the fin over the memory device is separated from the memory device by the first material.

14. An integrated circuit device package comprising:
    a package substrate;
    an integrated circuit device coupled with contacts on a surface of the package substrate;
    mold material on the surface of the package substrate, the mold material contacting one or more lateral sides of the integrated circuit device, the mold material extending at least to a surface of the integrated circuit device opposite the package substrate;

two or more separate fins directly on the surface of the integrated circuit device, the two or more fins comprising highly thermally conductive material, wherein the fins comprise metallic nanoparticles and cured adhesive;

fin pattern material directly on the surface of the integrated circuit device adjacent the two or more fins, the fin pattern material comprising material having a lower thermal conductivity than that of the two or more fins;

thermal interface material over the fins and fin pattern material; and a heat spreader in contact with the thermal interface material.

15. The integrated circuit device package of claim 14, wherein the two or more fins are directly in contact with locations on the surface of the integrated circuit device associated with relatively higher heat production.

16. The integrated circuit device package of claim 14, wherein the fin pattern material is the mold material.

17. The integrated circuit device package of claim 14, wherein the fin pattern material comprises metallic ink.

18. The integrated circuit device package of claim 14, wherein the two or more fins comprise one or more of: copper, aluminum, or phase change material.

19. A system comprising:
a system board;
a memory coupled with the system board; and
an integrated circuit device package coupled with the system board, the integrated circuit device package comprising:

a package substrate;

an integrated circuit device coupled with contacts on a surface of the package substrate;

mold material on the surface of the package substrate, the mold material contacting one or more lateral sides of the integrated circuit device, the mold material extending at least to a surface of the integrated circuit device opposite the package substrate;

two or more separate fins directly on the surface of the integrated circuit device, the two or more fins comprising highly thermally conductive material, wherein the fins comprise metallic nanoparticles and cured adhesive; and fin pattern material directly on the surface of the integrated circuit device adjacent the two or more fins, the fin pattern material comprising material having a lower thermal conductivity than that of the two or more fins.

20. The system of claim 19, wherein the two or more fins are directly in contact with locations on the surface of the integrated circuit device associated with relatively higher heat production.

21. The system of claim 19, wherein the mold material extends beyond the surface of the integrated circuit device to a surface coplanar with surfaces of the two or more fins.

22. The system of claim 19, wherein the fin pattern material comprises wirebond stubs.

23. The system of claim 19, wherein the two or more fins comprise one or more of: copper, aluminum, or phase change material.

* * * * *